United States Patent
Moon et al.

(10) Patent No.: US 11,726,721 B2
(45) Date of Patent: Aug. 15, 2023

(54) MEMORY DEVICE FOR ADJUSTING DELAY ON DATA CLOCK PATH, MEMORY SYSTEM INCLUDING THE MEMORY DEVICE, AND OPERATING METHOD OF THE MEMORY SYSTEM

(71) Applicant: Samsung Electronics Co., Ltd., Suwon-si (KR)

(72) Inventors: Byongmo Moon, Seoul (KR); Jihye Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 35 days.

(21) Appl. No.: 17/405,753

(22) Filed: Aug. 18, 2021

(65) Prior Publication Data
US 2022/0075564 A1 Mar. 10, 2022

(30) Foreign Application Priority Data

Sep. 9, 2020 (KR) .......... 10-2020-0115516
Jan. 13, 2021 (KR) .......... 10-2021-0004928

(51) Int. Cl.
  G06F 3/06 (2006.01)
  G11C 7/22 (2006.01)
  H01L 25/065 (2023.01)

(52) U.S. Cl.
  CPC ............ *G06F 3/0673* (2013.01); *G11C 7/222* (2013.01); *H01L 25/0652* (2013.01); *H01L 2225/06513* (2013.01); *H01L 2225/06541* (2013.01)

(58) Field of Classification Search
  CPC .. G06F 3/0673; G06F 13/161; G06F 13/1668; G11C 7/222; G11C 7/04;
  (Continued)

(56) References Cited

U.S. PATENT DOCUMENTS 8,121,237 B2   2/2012  Stott et al.
9,001,594 B2   4/2015  Bringivijayaraghavan
(Continued)

FOREIGN PATENT DOCUMENTS

EP    0827283 A2 *  8/1997
TW    201129986 A    9/2011
(Continued)

OTHER PUBLICATIONS

Extended European Search Report dated Feb. 8, 2022 for corresponding EP Patent Application No. 21193649.7.
(Continued)

*Primary Examiner* — Sultana Begum
(74) *Attorney, Agent, or Firm* — Muir Patent Law, PLLC

(57) ABSTRACT

A memory system includes a memory device configured to monitor a first oscillator count value for a write data strobe signal for sampling a data signal at a first temperature and a second oscillator count value for the write data strobe signal for sampling the data signal at a second temperature, and a memory controller configured to determine a weight based on the first oscillator count value and the second oscillator count value, wherein the memory device is configured to sample the data signal by adjusting a delay on a transfer path of the write data strobe signal according to a change in temperature of the memory device based on the weight.

20 Claims, 15 Drawing Sheets

(58) Field of Classification Search
CPC .......... G11C 2029/0409; G11C 29/023; G11C 29/028; H01L 25/0652; H01L 2225/06513; H01L 2225/06541
See application file for complete search history.

(56) References Cited

U.S. PATENT DOCUMENTS

| | | |
|---|---|---|
| 9,305,622 B1 | 4/2016 | Jeter |
| 10,373,686 B2 | 8/2019 | Tran et al. |
| 2002/0066001 A1 | 5/2002 | Olarig et al. |
| 2015/0003574 A1* | 1/2015 | Mozak .................. G11C 7/222 |
| | | 375/355 |
| 2015/0029800 A1* | 1/2015 | Iijima .................. G11C 7/1066 |
| | | 365/193 |
| 2016/0034189 A1 | 2/2016 | Kim et al. |
| 2017/0287539 A1 | 10/2017 | Mozak |
| 2019/0354480 A1 | 11/2019 | Lee et al. |
| 2021/0142834 A1 | 5/2021 | Moon |

FOREIGN PATENT DOCUMENTS

| | | |
|---|---|---|
| TW | 201843678 A | 12/2018 |
| TW | I645409 B | 12/2018 |

OTHER PUBLICATIONS

Office Action dated Nov. 3, 2022 for corresponding TW Patent Application No. 110131666.

* cited by examiner

| ELEMENT CHARACTERISTIC | DELAY (T1) | DELAY (T2) | WEIGHT |
|---|---|---|---|
| FIRST ELEMENT CHARACTERISTIC | D1 | D2 | WT1 |
| SECOND ELEMENT CHARACTERISTIC | D3 | D4 | WT2 |
| THIRD ELEMENT CHARACTERISTIC | D5 | D6 | WT3 |

FIG. 8

| REFERENCE TEMPERATURE | CURRENT TEMPERATURE | WEIGHT | DELAY CODE |
|---|---|---|---|
| TREF | TP | WT1 | DCODE1 |
| | | WT2 | DCODE2 |
| | | WT3 | DCODE3 |

FIG. 9

| DELAY CODE | REFERENCE VOLTAGE | REGULATED VOLTAGE |
|---|---|---|
| DCODE1 | VREF1 | VLDO1 |
| DCODE2 | VREF2 | VLDO2 |
| DCODE3 | VREF3 | VLDO3 |

MEMORY DEVICE FOR ADJUSTING DELAY ON DATA CLOCK PATH, MEMORY SYSTEM INCLUDING THE MEMORY DEVICE, AND OPERATING METHOD OF THE MEMORY SYSTEM

CROSS-REFERENCE TO RELATED APPLICATIONS

This application is based on and claims priority under 35 U.S.C. § 119 to Korean Patent Application Nos. 10-2020-0115516, filed on Sep. 9, 2020 and 10-2021-0004928, filed on Jan. 13, 2021, in the Korean Intellectual Property Office, the disclosures of which are incorporated by reference herein in their entirety.

BACKGROUND

The inventive concept relates to a semiconductor device, and more particularly, to a memory device which is configured to adjust delays on a data clock path, a memory system including the memory device, and an operating method of the memory system.

Electronic devices including smartphones, graphic accelerators, artificial intelligence (AI) accelerators, etc. may process data by using memory devices such as dynamic random access memory (DRAM). Electronic devices may control internal or external memory devices through a memory controller. A memory controller may transmit various signals to a memory device to control the memory device.

A memory device and a memory controller may transmit and receive data through a data signal. A memory device may sample a data signal by using a data clock signal (or a write data strobe signal) provided from a memory controller. For example, a memory device may sample a data signal based on an edge timing of a data clock signal. To sample a data signal based on a data clock signal, a memory device may transfer the data clock signal to a circuit for sampling a data signal. A memory controller may perform trainings in relation to a data clock signal to compensate for a delay on a path for transferring a data clock signal (hereinafter, referred to as a data clock path).

A delay on a data clock path may vary according to a change in temperature of a memory device. When a sampling timing changes due to variations of a delay on a data clock path, a setup/hold (S/H) margin may decrease. A memory controller may perform retrainings to compensate for variations of delays according to temperature changes. Accordingly, a memory controller may adjust a delay on a data clock path. However, when a retraining is performed, resources used for the training may increase.

SUMMARY

The inventive concept provides a memory device configured to adjust delays on a data clock path without retrainings by a memory controller, a memory system including the memory device, and an operating method of the memory system.

According to an aspect of the inventive concept, there is provided a memory system including a memory device configured to monitor a first oscillator count value for a write data strobe signal for sampling a data signal at a first temperature and a second oscillator count value for the write data strobe signal for sampling the data signal at a second temperature, and a memory controller configured to determine a weight based on the first oscillator count value and the second oscillator count value, wherein the memory device is configured to sample the data signal by adjusting a delay on a transfer path of the write data strobe signal according to a change in temperature of the memory device based on the weight.

According to another aspect of the inventive concept, there is provided an operating method of a memory system including a memory controller and a memory device configured to sample a data signal provided from the memory controller based on a write data strobe signal provided from the memory controller, wherein the method includes: requesting, by the memory controller, a first oscillator count value of the write data strobe signal at a first temperature from the memory device; transmitting, by the memory device, the first oscillator count value to the memory controller; requesting, by the memory controller, a second oscillator count value of the write data strobe signal at a second temperature from the memory device; transmitting, by the memory device, the second oscillator count value to the memory controller; setting, by the memory controller, a weight determined based on the first oscillator count value and the second oscillator count value to the memory device; and sampling, by the memory device, the data signal by adjusting a delay on a transfer path of the write data strobe signal according to a change in temperature of the memory device based on the weight.

According to another aspect of the inventive concept, there is provided a memory device including a data sampler configured to sample a data signal based on a write data strobe signal, a storage circuit configured to store a weight representing an amount of variations of a delay on a transfer path of the write data strobe signal according to a temperature change, a temperature sensor configured to sense temperature, a temperature compensator configured to generate a delay code based on the sensed temperatures and a weight, a reference voltage generator configured to generate a reference voltage from a power supply voltage based on the delay code, a voltage regulator configured to generate a regulated voltage based on the reference voltage, and a write data strobe signal transfer circuit configured to transfer the write data strobe signal to the data sampler by using the regulated voltage.

BRIEF DESCRIPTION OF THE DRAWINGS

Embodiments of the inventive concept will be more clearly understood from the following detailed description taken in conjunction with the accompanying drawings in which:

FIG. 8 illustrates an exemplary operation of a temperature compensator of FIG. 7;

FIG. 9 illustrates an exemplary operation of a reference voltage generator and a voltage regulator of FIG. 7;

DETAILED DESCRIPTION OF THE EMBODIMENTS

Hereinafter, embodiments of the inventive concept will be described clearly and with sufficient detail to the extent that a person with ordinary skill in the art would be able to carry out the inventive concept.

Figure 1:
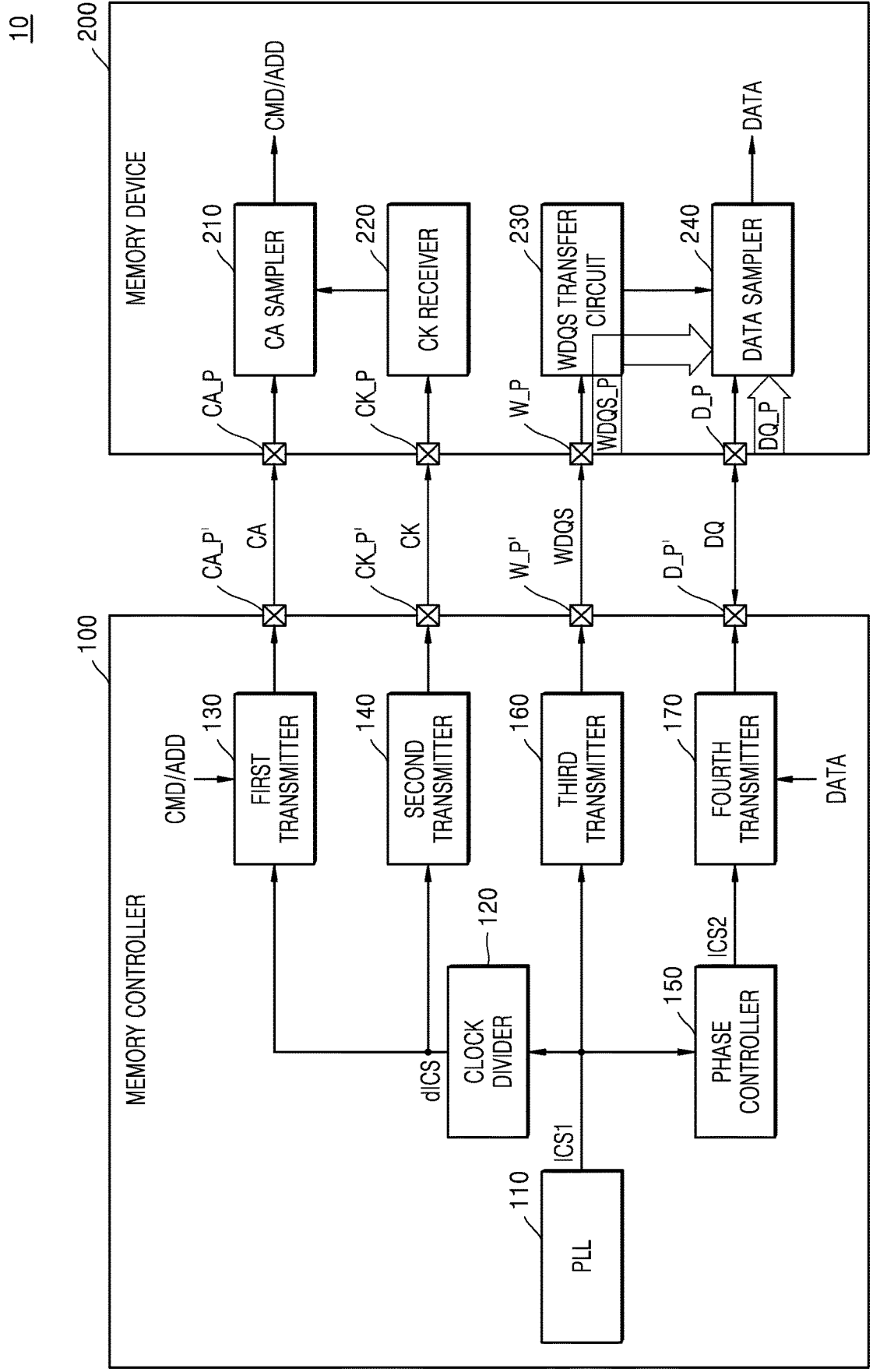
FIG. 1 is a block diagram illustrating a memory system according to an embodiment.

FIG. 1 is a block diagram illustrating a memory system 10 according to an embodiment. With reference to FIG. 1, the memory system 10 may include a memory controller 100 and a memory device 200. The memory controller 100 may control overall operations of the memory device 200. For example, the memory controller 100 may control the memory device 200 so that data DATA is output from the memory device 200, or stored in the memory device 200.

The memory controller 100 may transmit various signals to the memory device 200 and receive various signals from the memory device 200. For example, the memory controller 100 may transmit a command/address signal CA, a clock signal CK, a write data strobe signal WDQS, and a data signal DQ to the memory device 200, and receive a data signal DQ from the memory device 200. For example, the data signal DQ is a multi-bit signal. The command/address signal CA may include a command CMD and/or an address ADD, and a data signal DQ may include data DATA.

The memory controller 100 may be implemented in a host (not explicitly shown in the drawings) and access the memory device 200 according to a request of an internal processor (not explicitly shown in the drawings) of the host. For example, the memory controller 100 may access the memory device 200 in a direct memory access (DMA) manner. For example, the memory controller 100 may be implemented as a part of a System-on-Chip (SoC), but the implementation is not limited thereto.

The memory device 200 may operate as a buffer memory, a working memory, or a main memory for a host including the memory controller 100. The memory device 200 may operate according to control by the memory controller 100. For example, the memory device 200 may output data DATA stored according to control by the memory controller 100, or store data DATA provided from the memory controller 100.

The memory device 200 may receive various signals from the memory controller 100 and transmit various signals to the memory controller 100. For example, the memory device 200 may receive a command/address signal CA, a clock signal CK, a write data strobe signal WDQS, and a data signal DQ from the memory controller 100, and transmit a data signal DQ to the memory device 200.

The memory controller 100 may include a phase locked loop 110, a clock divider 120, a first transmitter 130, a second transmitter 140, a phase controller 150, a third transmitter 160, and a fourth transmitter 170. The phase locked loop 110 may generate a first internal clock signal ICS1. For example, the first internal clock signal ICS1 may have a specific frequency and toggle between a high level and a low level. The clock divider 120 may divide the first internal clock signal ICS1 to generate a divided internal clock signal dICS. For example, the frequency of the divided internal clock signal dICS may be half of the frequency of the first internal clock signal ICS1. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The first transmitter 130 may transmit the command/address signal CA to the memory device 200 based on the divided internal clock signals dICS. For example, the first transmitter 130 may transmit the command CMD and/or addresses ADD to the memory device 200 through the command/address signal CA at a rising edge and/or falling edge timing of the divided internal clock signal dICS. The command/address signals CA may be transmitted to the memory device 200 through a command/address pin CA_P'.

The second transmitter 140 may transmit divided internal clock signal dICS to the memory device 200 as a clock signal CK. For example, the divided internal clock signal dICS and the clock signal CK may have the same frequency and phase. A clock signal CK may be transmitted to the memory device 200 through a clock pin CK_P'.

The phase controller 150 may generate a second internal clock signal ICS2 having a phase different from the phase of the first internal clock signal ICS1 based on the first internal clock signal ICS1. For example, the phase difference between the first internal clock signal ICS1 and the second internal clock signal ICS2 may be 90 degrees.

The third transmitter 160 may transmit the first internal clock signal ICS1 to the memory device 200 as a write data strobe signal WDQS. For example, the first internal clock signal ICS1 and the write data strobe signal WDQS may have the same frequency and phase. For example, when the frequency of the first internal clock signal ICS1 is twice the frequency of the divided internal clock signal dICS, the frequency of the write data strobe signal WDQS may be twice the frequency of the clock signal CK. The write data strobe signal WDQS may be transmitted to the memory device 200 through a write data strobe pin W_P'.

The fourth transmitter 170 may transmit a data signal DQ to the memory device 200 based on the second internal clock signal ICS2. For example, the fourth transmitter 170 may transmit data DATA to the memory device 200 through the data signal DQ at a rising edge and/or falling edge timing of the second internal clock signal ICS2. The data signal DQ may be transmitted to the memory device 200 through a data pin D_P'.

As described above, the clock signal CK and write data strobe signal WDQS may be generated through a single phase locked loop 110. Accordingly, an operational current of the memory controller 100 may decrease. However, the inventive concept is not limited thereto, and each of the clock signal CK and the write data strobe signal WDQS may be generated through each separate phase locked loop.

The memory device 200 may include a command/address sampler 210, a clock receiver 220, a write data strobe signal WDQS transfer circuit 230, and a data sampler 240. The clock receiver 220 may receive a clock signal CK from the memory controller 100 through a clock pin CK_P. The clock signal CK received by the clock receiver 220 may be transmitted to the command/address sampler 210.

The command/address sampler 210 may receive the command/address signal CA from the memory controller 100 through a command/address pin CA_P. The command/address sampler 210 may sample the command/address signal CA based on the clock signal CK. For example, the command/address sampler 210 may sample the command/address signal CA at a rising edge and/or falling edge timing of clock signal CK. Accordingly, the memory device 200 may obtain command and/or address CMD/ADD.

The WDQS transfer circuit 230 may receive write data strobe signal WDQS from the memory controller 100 through a write data strobe pin W_P. The WDQS transfer circuit 230 may transfer write data strobe signal WDQS to the data sampler 240. In example embodiments, the WDQS transfer circuit 230 may include a write data strobe signal WDQS receiver and a write data strobe signal WDQS tree circuitry. For example, the write data strobe signal WDQS receiver may receive write data strobe signal WDQS provided through the write data strobe pin W_P. The write data strobe signal WDQS tree circuitry may include multiple repeaters configured to transfer the write data strobe signal WDQS output from the write data strobe signal WDQS receiver to the data sampler 240. For example, each of the multiple repeaters may be implemented by at least one buffer or inverter.

The data sampler 240 may receive a data signal DQ from the memory controller 100 through a data pin D_P. The data sampler 240 may sample a data signal DQ based on a write data strobe signal WDQS. For example, the data sampler 240 may sample a data signal DQ at a rising edge and/or falling edge timing of a write data strobe signal WDQS. Accordingly, the memory device 200 may obtain data DATA.

As described above, the memory device 200 may sample a data signal DQ based on a write data strobe signal WDQS different from a clock signal CK. For example, a write data strobe signal WDQS may be a clock signal (i.e., a data clock signal) for data communication.

In example embodiments, trainings may be performed in relation to a write data strobe signal WDQS to compensate for a delay on a path transferring the write data strobe signal WDQS to the data sampler 240 in an initialization process of the memory device 200. Accordingly, a transfer timing (i.e., a sampling timing) of the write data strobe signal WDQS may be determined to increase an S/H margin of the data sampler 240.

In example embodiments, a path through which a write data strobe signal WDQS are transferred from the write data strobe pin W_P to the data sampler 240 (hereinafter, referred to as a WDQS path WDQS_P) may not match a path through which a data signal DQ is transferred from the data pin D_P to the data sampler 240 (hereinafter, referred to as a DQ path DQ_P). For example, circuits on the WDQS path WDQS_P and DQ path DQ_P may be arranged in an asymmetrical manner. For example, the number of transistors included in the WDQS path WDQS_P may be different from that of the number of transistors included in each DQ path DQ_P. In such case, even when trainings are performed in relation to a write data strobe signal WDQS in the initialization process of the memory device 200, variations of delays on the WDQS path WDQS_P may be different from those on the DQ path DQ_P as a result temperature changes that may occur subsequent to when the trainings are performed. Accordingly, an arrival timing (i.e., a sampling timing) of a write data strobe signal WDQS transferred to the data sampler 240 may change. In particular, variations of delays on the WDQS path WDQS_P according to temperature changes may change based on characteristics of elements on the WDQS path WDQS_P. Accordingly, an S/H margin of the data sampler 240 may decrease.

According to some embodiments, variations of delays on the WDQS path WDQS_P according to temperature changes may be compensated without performing retrainings in relation to a write data strobe signal WDQS. The memory device 200 may adjust delays on the WDQS path WDQS_P according to temperature changes, which are detected in real time considering characteristics of circuits on the WDQS path WDQS_P. Accordingly, delays on the WDQS path WDQS_P based on trainings performed during the initialization process of the memory device 200 may be maintained. Therefore, an S/H margin of the data sampler 240 may increase regardless of temperature changes, and also data errors may be reduced.

Figure 2:
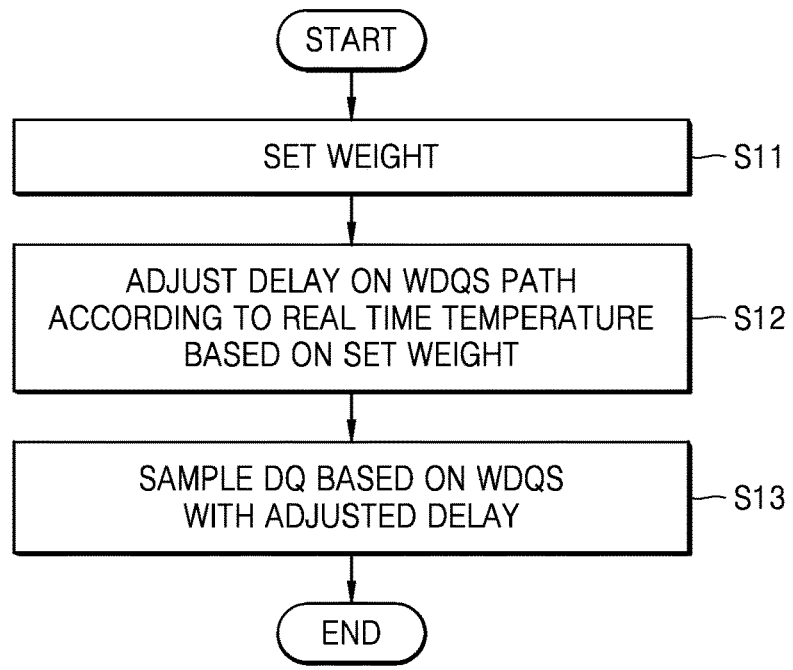
FIG. 2 is a flowchart illustrating an exemplary operation of the memory system of FIG. 1.

FIG. 2 is a flowchart illustrating an operation example of the memory system of FIG. 1. In particular, the operation of adjusting delays on the WDQS path based on temperature changes, by the memory system 10 will be explained with reference to FIG. 2. With reference to FIGS. 1 and 2, in operation S11, the memory system 10 may determine a weight. The weight may represent an amount of variations of a delay on the WDQS path according to a temperature change. For example, the memory controller 100 may determine the weight in the initialization process of the memory device 200 or in the test process for the memory device 200. The determined weight is stored in a register or fuse of the memory device 200, and may be set to the memory device 200. Embodiments describing the setting of the weight by the memory system 10 will be further explained in detail with reference to FIGS. 3 to 6.

In operation S12, the memory system 10 may adjust a delay on the WDQS path according to real time temperature based on the set weight. For example, the memory device 200 may sense temperature in real time. The memory device 200 may adjust the delay on the WDQS path based on the sensed temperature. For example, the memory device 200 may regulate a voltage applied to the WDQS transfer circuit 230 to adjust the delay, or control delay cells of the WDQS transfer circuit 230. The scale of delay to be adjusted may vary depending on the set weight. Accordingly, even when the temperature of the memory device 200 changes in real time, delays on the WDQS path may remain steady. For example, delays under the initialization state of the memory device 200 or delays at a reference temperature may be maintained consistently. Embodiments describing the adjusting of delays on the WDQS path by the memory device 200 will be further explained in detail with reference to FIGS. 7 to 14.

In operation S13, the memory system 10 may sample a data signal DQ based on a write data strobe signal WDQS with an adjusted delay. For example, write data strobe signal WDQS may be transferred to the data sampler 240 through the WDQS transfer circuit 230. In such case, an arrival timing at which the write data strobe signal WDQS reaches the data sampler 240 may remain constant regardless of changes in temperature of the memory device 200. The data sampler 240 may sample the data signal DQ based on the write data strobe signal WDQS.

According to the memory system 10 of the inventive concept, the memory device 200 may compensate for variations of delays on the WDQS path according to real time temperature changes based on weights set in the initialization process or the test process. For example, delays on the WDQS path may remain constant without retrainings by the memory controller 100. As a result, retrainings to compensate for variations of delays on the WDQS path according to temperature changes may not be performed, and thus, resources for retrainings may be reduced.

Hereinafter, embodiments describing the operation of setting weights by the memory system 10 will be further explained in detail with reference to FIGS. 3 to 6.

Figure 3:
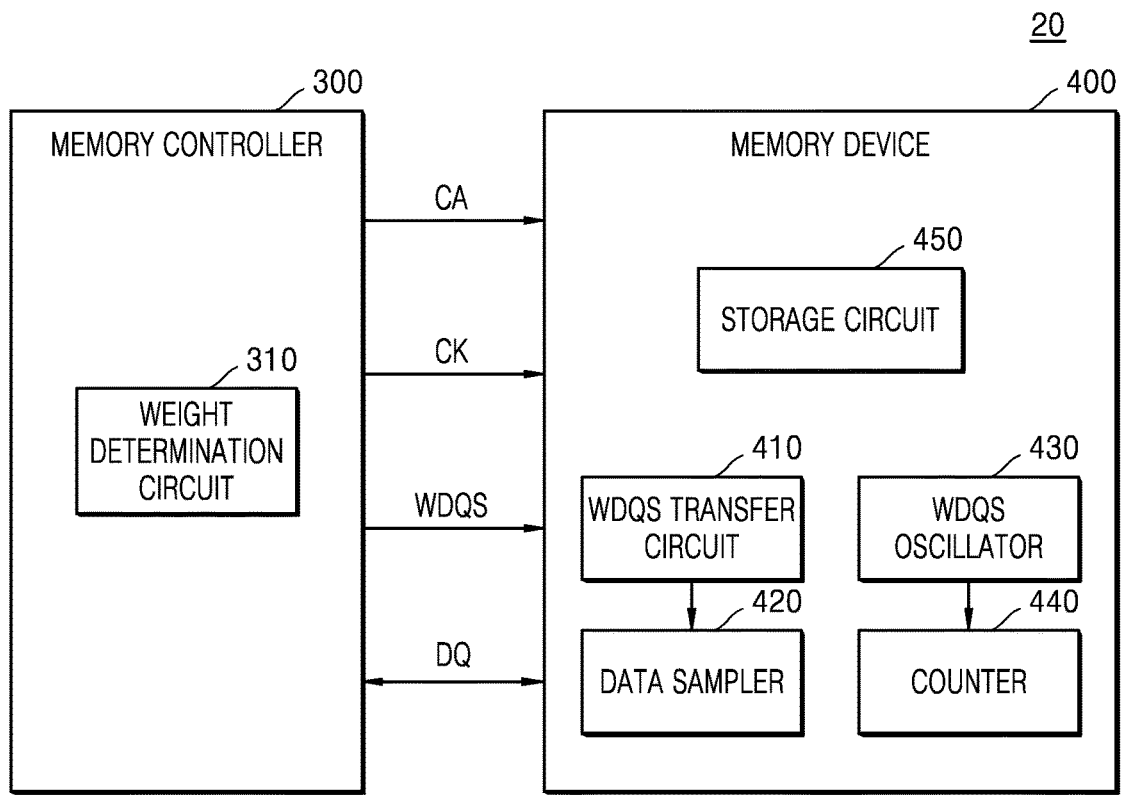
FIG. 3 is a block diagram illustrating the memory system of FIG. 2 configured to set weights according to an embodiment.

FIG. 3 is a block diagram of the memory system of FIG. 2 which is configured to set weights according to an embodiment. With reference to FIG. 3, a memory system 20 may include a memory controller 300 and a memory device 400. The memory controller 300 and the memory device 400 may correspond to the memory controller 100 and the memory device 200 of FIG. 1, respectively. Accordingly, repeated descriptions thereof are omitted hereinafter.

The memory controller 300 may include a weight determination circuit 310. The weight determination circuit 310 may control an initialization operation or a test operation of the memory device 400. The weight determination circuit 310 may determine weights in the initialization operation or test operation of the memory device 400, and set the determined weights to the memory device 400. For example, the weight determination circuit 310 may be implemented by a processor such as a CPU of the memory controller 300, but the inventive concept is not limited thereto.

In example embodiments, the weight determination circuit 310 may request, from the memory device 400, oscillation information regarding a write data strobe signal WDQS at each of two predetermined temperatures. The weight determination circuit 310 may receive oscillation information regarding the write data strobe signal WDQS from the memory device 400. The weight determination circuit 310 may determine a weight based on oscillation information regarding the write data strobe signal WDQS at two temperatures. The weight determination circuit 310 may transmit the determined weight to the memory device 400. For example, the memory controller 300 may further include a temperature sensor configured to sense temperature.

The memory device 400 may include a WDQS transfer circuit 410, a data sampler 420, a WDQS oscillator 430, a counter 440, and a storage circuit 450. The WDQS transfer circuit 410 may transfer the write data strobe signal WDQS provided from the memory controller 300 to the data sampler 420. The data sampler 420 may sample a data signal DQ provided from the memory controller 300 based on a write data strobe signal WDQS.

The WDQS oscillator 430 may be a replica of the WDQS transfer circuit 410. The WDQS oscillator 430 may be configured to match the WDQS transfer circuit 410. Accordingly, a delay in a signal output from the WDQS oscillator 430 may be substantially identical to a delay in a write data strobe signal output from the WDQS transfer circuit 410. For example, a delay on the WDQS path may be substantially identical to a delay on a replica path. Terms such as "identical," "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise.

The WDQS oscillator 430 may generate a replica signal corresponding to the write data strobe signal WDQS. For example, the WDQS oscillator 430 may operate in response to a command or a control signal from the memory controller 300. Because the WDQS oscillator 430 is a replica of the WDQS transfer circuit 410, an oscillation value (e.g., the number of oscillations) of the replica signal may be substantially identical to an oscillation value (e.g., the number of oscillations) of the write data strobe signal WDQS. For example, the WDQS oscillator 430 may be implemented by a ring oscillator, but the inventive concept is not limited thereto.

The counter 440 may calculate an oscillator count value for a replica signal output from the WDQS oscillator 430. For example, the counter 440 may count the number of oscillations of the replica signal. The oscillator count value for the replica signal calculated by the counter 440 may be substantially identical to the number of oscillations of the write data strobe signal WDQS. Accordingly, the oscillator count value calculated by the counter 440 may correspond to a delay on the WDQS path. The oscillator count value calculated by the counter 440 may be transmitted to the memory controller 300 as oscillation information regarding the write data strobe signal WDQS (i.e., delay information on the WDQS path).

The storage circuit 450 may store weights provided from the memory controller 300. In example embodiments, the storage circuit 450 may be implemented by a register or fuse. For example, when a weight is set in the initialization process of the memory device 400, the storage circuit 450 may be a mode register. For example, when a weight is set in the test process of the memory device 400, the storage circuit 450 may be a test mode register or a fuse.

Figure 4:
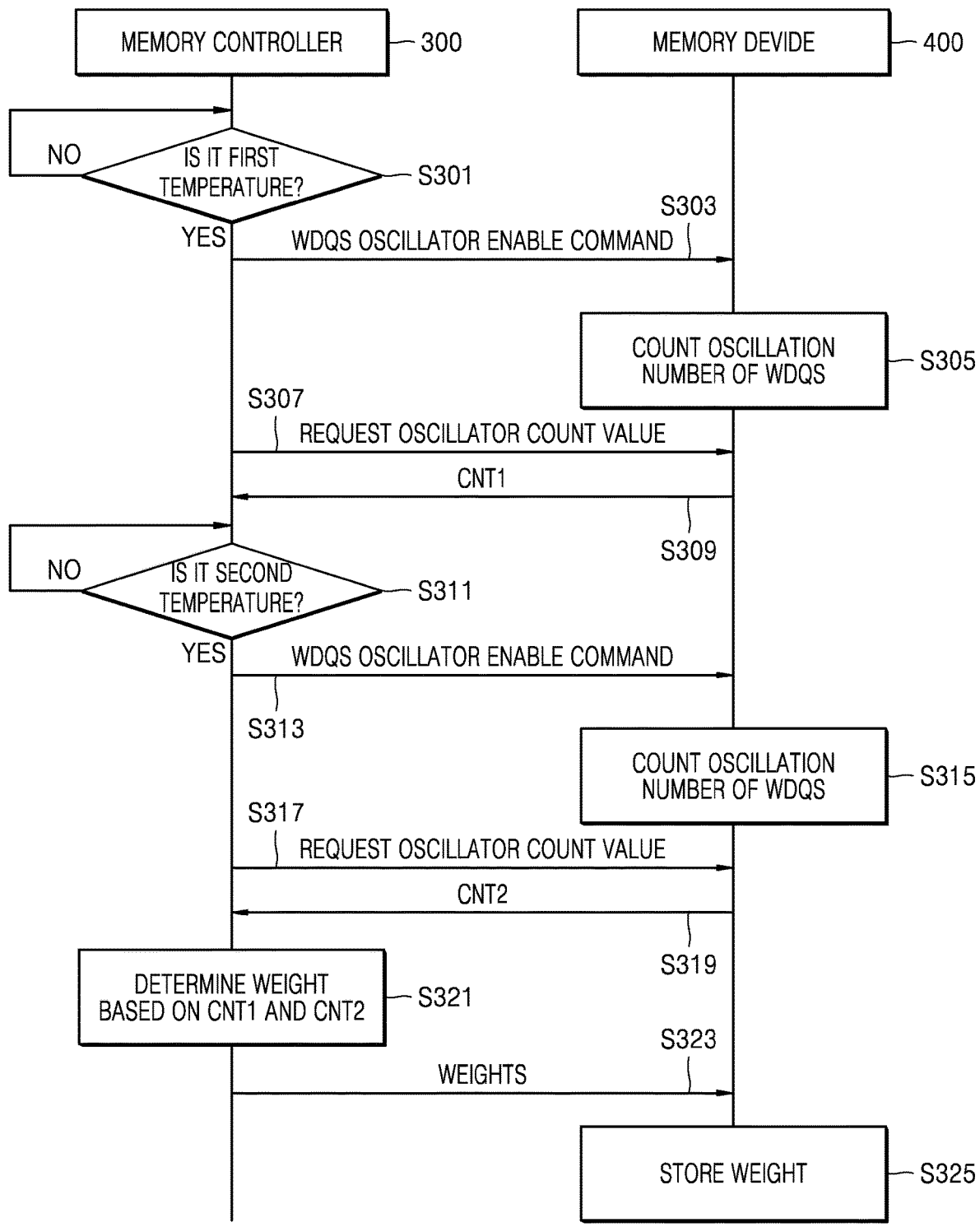
FIG. 4 is an exemplary flowchart illustrating the weight setting operation of the memory system of FIG. 3.

FIG. 4 is an exemplary flowchart illustrating the operation of setting a weight by the memory system of FIG. 3. With reference to FIGS. 3 and 4, in operation S301, the memory controller 300 may determine whether the temperature of the memory system 20 (i.e. the memory controller 300 or the memory device 400) is a first temperature. For example, the memory controller 300 may determine through an internal temperature sensor whether the temperature of the memory system 20 is equal to the first temperature. As another example, the memory device 400 may include an internal temperature sensor, the memory controller 300 may request temperature information from the memory device 400 and receive the temperature information regarding the memory system 20 from the memory device 400. In some embodiments, in operation S301, the memory controller 300 may determine whether the temperature of the memory system 20 is equal to or higher than the first temperature. In some embodiments, in operation S301, the memory controller 300 may determine whether the temperature of the memory system 20 exceeds the first temperature.

When the temperature of the memory system 20 is equal to the first temperature, the memory controller 300 may transmit a WDQS oscillator enable command to the memory device 400 in operation S303. For example, the memory controller 300 may transmit a WDQS oscillator enable command to the memory device 400 through command/address signals CA. However, the inventive concept is not limited thereto, and the memory controller 300 may transmit a WDQS oscillator enable command to the memory device 400 through a separate control signal. In some embodiments, when the temperature of the memory system 20 is equal to or higher than the first temperature, the memory controller 300 may transmit a WDQS oscillator enable command to the memory device 400 in operation S303. In some embodiments, when the temperature of the memory system 20 exceeds the first temperature, the memory controller 300 may transmit a WDQS oscillator enable command to the memory device 400 in operation S303.

In operation S305, the memory device 400 may count the number of oscillations of a write data strobe signal WDQS in response to the WDQS oscillator enable command. For example, the memory device 400 may enable the WDQS oscillator 430 and the counter 440 in response to the WDQS oscillator enable command. Accordingly, the memory device 400 may count the number of oscillations of the write data strobe signal WDQS by counting the number of oscillations of a replica signal.

In operation S307, the memory controller 300 may request an oscillator count value from the memory device 400. For example, the memory controller 300 may transmit a command to request an oscillator count value to the memory device 400 through command/address signals CA. However, the inventive concept is not limited thereto, and the memory controller 300 may request an oscillator count value from the memory device 400 through a separate control signal.

In operation S309, the memory device 400 may transmit the first oscillator count value CNT1 to the memory controller 300 in response to a request from the memory controller 300. For example, the first oscillator count value CNT1 may be an oscillator count value for the write data strobe signal WDQS at the first temperature. For example, the memory device 400 may transmit the first oscillator count value CNT1 to the memory controller 300 through the data signal DQ, but the inventive concept is not limited thereto.

In operation S311, the memory controller 300 may determine whether the temperature of the memory system 20 is equal to a second temperature. For example, the first temperature may be room temperature (e.g., approximately 20 degrees Celsius), and the second temperature may be a temperature hotter than room temperature. In some embodiments, in operation S311, the memory controller 300 may determine whether the temperature of the memory system 20 is equal to or higher than the second temperature. In some embodiments, in operation S311, the memory controller 300 may determine whether the temperature of the memory system 20 exceeds the second temperature. When the temperature of the memory system 20 is equal to the second temperature, the memory controller 300 may transmit a WDQS oscillator enable command to the memory device 400 in operation S313. In some embodiments, when the temperature of the memory system 20 is equal to or higher than the second temperature, the memory controller 300 may transmit a WDQS oscillator enable command to the memory device 400 in operation S313. In some embodiments, when the temperature of the memory system 20 exceeds the second temperature, the memory controller 300 may transmit a WDQS oscillator enable command to the memory device 400 in operation S313. In operation S315, the memory device 400 may count the number of oscillations of the write data strobe signal WDQS in response to a WDQS oscillator enable command. For example, the memory device 400 may count the number of oscillations of the write data strobe signal WDQS by counting the number of oscillations of replica signals. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In operation S317, the memory controller 300 may request an oscillator count value from the memory device 400. In operation S319, the memory device 400 may transmit the second oscillator count value CNT2 to the memory controller 300 in response to a request from the memory controller 300. For example, the second oscillator count value CNT2 may be an oscillator count value for the write data strobe signal WDQS at the second temperature.

In operation S321, the memory controller 300 may determine a weight based on the first oscillator count value CNT1 and the second oscillator count value CNT2. For example, the memory controller 300 may calculate the weight on the assumption that an oscillator count value for the write data strobe signals WDQS from the first temperature to the second temperature vary in a linear manner. The calculated weight may represent an amount of variations of a delay on the WDQS path according to changes in temperature of the memory system 20.

In operation S323, the memory controller 300 may transmit a weight to the memory device 400. For example, the memory controller 300 may transmit a weight to the memory device 400 along with a weight set command through a command/address signal CA. For example, the memory controller 300 may transmit a weight to the memory device 400 based on a mode register set (MRS) command. As another example, the memory controller 300 may transmit a weight to the memory device 400 based on a test mode register set (TMRS) command.

In operation S325, the memory device 400 may store a weight provided from the memory controller 300. For example, the memory device 400 may store a weight in response to a weight set command (e.g., MRS commands or TMRS commands) from the memory controller 300. The weight may be stored in the storage circuit 450.

Figures 5, 6:
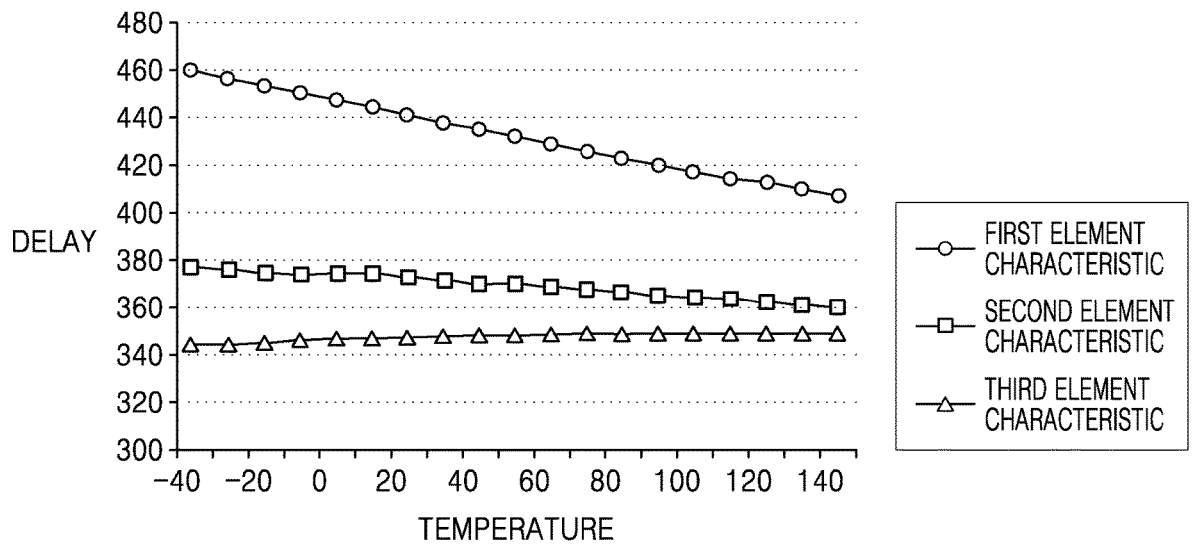
FIG. 5 is a graph showing an example of variations of delays on a write data strobe signal WDQS path according to element characteristics of a memory device of FIG. 3.
FIG. 6 illustrates an example of weight determination by a memory controller of FIG. 3 according to the example indicated in FIG. 5.

FIG. 5 is a graph showing an example of variations of delays on the WDQS path according to element characteristics of the memory device of FIG. 3. The horizontal axis of the graph in FIG. 5 represents a temperature, and the vertical axis represents a delay on the WDQS path. With reference to FIGS. 3 and 5, an amount of variations of delays on the WDQS path according to temperature changes may vary according to element characteristics of the WDQS transfer circuit 410. The element characteristics may be assorted by process corners of elements on the WDQS path (e.g., a transistor). For example, the element characteristics may be divided into a slow process corner, a typical process corner, and a fast process corner.

As illustrated in FIG. 5, when elements of the WDQS transfer circuit 410 have a first element characteristic (e.g., when elements of the WDQS transfer circuit 410 correspond to a slow process corner) and when the temperature of the memory system 20 increases, a reduction in delays on the WDQS path may occur.

As also illustrated in FIG. 5, when elements of the WDQS transfer circuit 410 have a second element characteristic (e.g., when elements of the WDQS transfer circuit 410 correspond to a typical process corner) and when the temperature of the memory system 20 increases, a reduction in delays on the WDQS path may occur. As illustrated in FIG. 5, the delay reduction amount corresponding to the second element characteristic may be less than the delay reduction amount corresponding to the first element characteristic.

As further illustrated in FIG. 5, when elements of the WDQS transfer circuit 410 have a third element characteristic (e.g., when elements of the WDQS transfer circuit 410 correspond to a fast process corner) and when the temperature of the memory system 20 increases, an increase in delays on the WDQS path may occur.

As described in FIG. 5, delays on the WDQS path according to element characteristics of the WDQS transfer circuit 410 may vary in a linear manner (or approximately in a linear manner) according to temperature changes. Accordingly, weights reflecting element characteristics may be calculated based on delay values on the WDQS path corresponding to two temperatures. For example, a weight may be calculated by a slope of a variation of delays according to temperature changes. Therefore, when the memory device 400 compensates for variations of delays by using a weight calculated based on delay values at two temperatures, a temperature compensation reflecting element characteristics may be performed.

FIG. 6 illustrates an example of weight determination by the memory controller of FIG. 3 according to the example indicated in FIG. 5. In particular, FIG. 6 illustrates an example of operation determining each of a plurality of different weights according to element characteristics by the memory controller 300.

With reference to FIGS. 3, 5, and 6, the memory controller 300 may calculate weights based on delays corresponding to each of the first temperature T1 and the second temperature T2. For example, the memory controller 300 may receive, as explained with reference to FIG. 4, oscillator count values for a write data strobe signal WDQS at the first temperature T1 and the second temperature T2, respectively from the memory device 400. In this case, the oscillator count values corresponding to each of the first temperature T1 and the second temperature T2 may correspond to delay values corresponding to the first temperature T1 and the second temperature T2, respectively.

When elements of the WDQS transfer circuit 410 have a first element characteristic, the memory controller 300 may calculate a first weight WT1 based on a first delay D1 corresponding to the first temperature T1 and a second delay D2 corresponding to the second temperature T2. For example, the first weight WT1 may represent a slope of a delay variation according to a temperature change under the first element characteristic.

When elements of the WDQS transfer circuit 410 have a second element characteristic, the memory controller 300 may calculate a second weight WT2 based on a third delay D3 corresponding to the first temperature T1 and a fourth delay D4 corresponding to the second temperature T2. For example, the second weight WT2 may represent a slope of a delay variation according to a temperature change under the second element characteristic.

When elements of the WDQS transfer circuit 410 have a third element characteristic, the memory controller 300 may calculate a third weight WT3 based on a fifth delay D5 corresponding to the first temperature T1 and a sixth delay D6 corresponding to the second temperature T2. For example, the third weight WT3 may represent a slope of delay variation according to a temperature change under the third element characteristic.

As described above, the memory controller 300 may determine weights reflecting element characteristics of the WDQS transfer circuit 410 based on oscillator count values for write data strobe signals WDQS at two temperatures. The memory controller 300 may store weights reflecting element characteristics in the memory device 400. Accordingly, the memory device 400 may adjust delays on the WDQS path according to temperature changes by reflecting element characteristics.

Hereinafter, embodiments describing adjustment of delays on the WDQS path by the memory system 10 will be further explained with reference to FIGS. 7 to 14. In particular, embodiments describing adjustment of delays by changing a voltage applied to delay cells on the WDQS path by means of the voltage regulator and embodiments describing delay adjustment by controlling delay cells on the WDQS path, with reference to FIGS. 7 to 11 and FIGS. 12 to 14, respectively.

Figure 7:
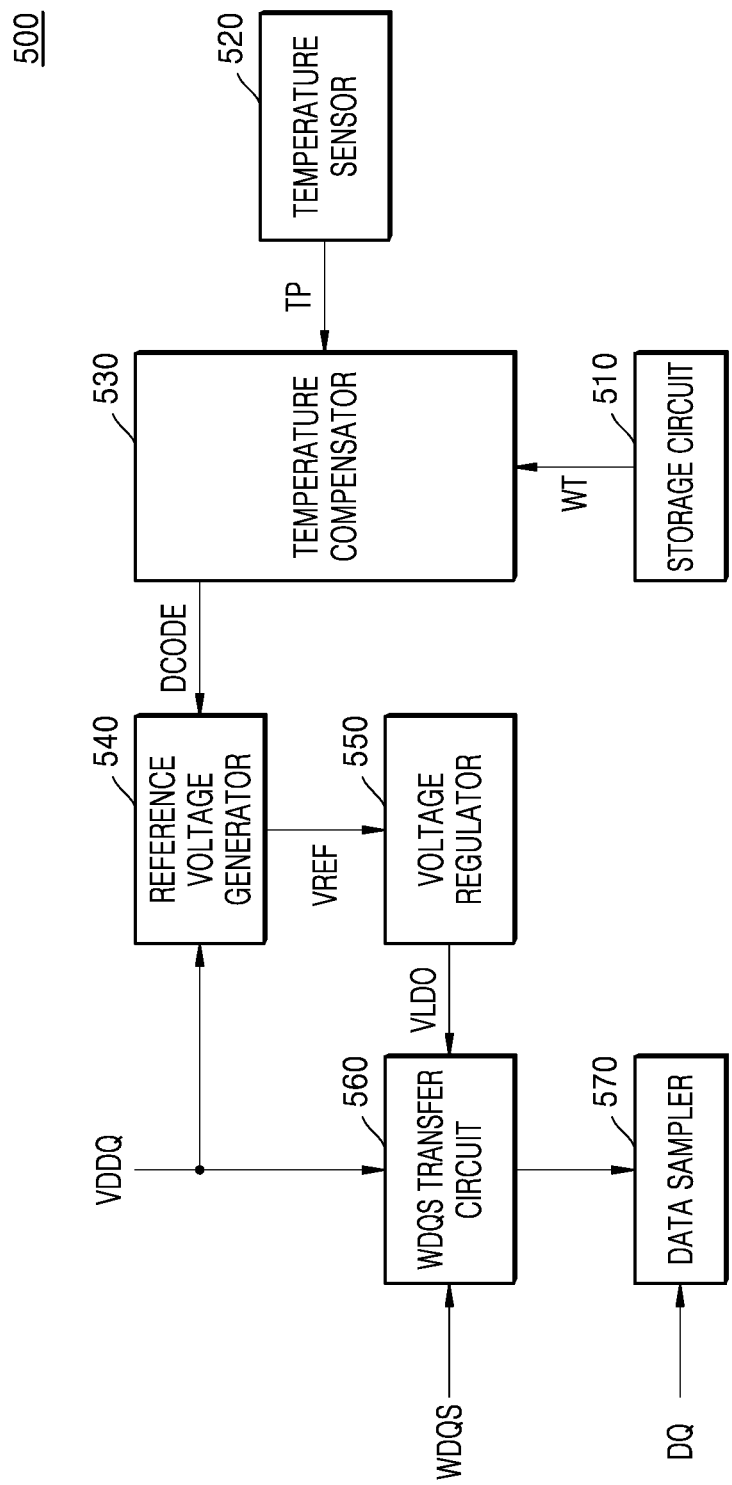
FIG. 7 is a block diagram illustrating the memory device configured to adjust delays on a WDQS path according to an embodiment.

FIG. 7 is a block diagram illustrating the memory device configured to adjust delays on the WDQS path according to an embodiment. With reference to FIG. 7, the memory device 500 may correspond to the memory devices 200 and 400 described with reference to FIGS. 1 to 6. Accordingly, repeated descriptions thereof are omitted hereinafter.

The memory device 500 may include a storage circuit 510, a temperature sensor 520, a temperature compensator 530, a reference voltage generator 540, a voltage regulator 550, a WDQS transfer circuit 560, and a data sampler 570. The storage circuit 510 may correspond to the storage circuit 450 of FIG. 3, and the WDQS transfer circuit 560 and the data sampler 570 may correspond to the WDQS transfer circuit 230 and the data sampler 240 of FIG. 1, respectively.

The storage circuit 510 may store weights WT. As described with reference to FIGS. 1 to 6, weights WT may be determined by the memory controllers 100 and 300 during the initialization process or the test process. For example, the storage circuit 510 may be implemented by one of a mode register, a test mode register, and a fuse.

The temperature sensor 520 may sense the temperature of the memory device 500. The temperature sensor 520 may provide the sensed current temperature TP to the temperature compensator 530.

The temperature compensator 530 may generate a delay code DCODE based on the current temperature TP and the weight WT. The delay code DCODE may correspond to a delay adjustment amount for adjusting delays on the WDQS path. For example, the temperature compensator 530 may calculate temperature changes based on a predetermined reference temperature and the current temperature TP, and generate a delay code DCODE for adjusting delays based on weights WT. For example, when delays on the WDQS path are adjusted according to a delay code DCODE, the delays on the WDQS path may remain constant regardless of temperature changes.

The reference voltage generator 540 may generate a reference voltage VREF from the power supply voltage VDDQ based on a delay code DCODE. The reference voltage generator 540 may generate a reference voltage VREF having a level corresponding to a delay code DCODE. For example, the reference voltage generator 540 may generate reference voltages VREF having different levels corresponding to each different delay code DCODE.

The voltage regulator 550 may generate a regulated voltage VLDO based on a reference voltage VREF. For example, the voltage regulator 550 may generate a regulated voltage VLDO having a level lower than that of a reference voltage VREF. The regulated voltage VLDO output from the voltage regulator 550 may be provided to the WDQS transfer circuit 560.

The WDQS transfer circuit 560 may transfer write data strobe signals WDQS to the data sampler 570. The WDQS transfer circuit 560 may transfer write data strobe signals WDQS to the data sampler 570 by using the power supply voltage VDDQ and the regulated voltage VLDO. For example, some of the repeaters (or inverters) of the WDQS transfer circuit 560 may operate by using the power supply voltage VDDQ, and the others may operate by using the regulated voltage VLDO. In this case, delays of write data strobe signals WDQS transferred through the repeaters operated by using the regulated voltage VLDO may be controlled according to a level of the regulated voltage VLDO.

The data sampler 570 may sample a data signal DQ based on a write data strobe signal WDQS. When delays on the WDQS path are adjusted based on a regulated voltage VLDO, an S/H margin of the data sampler 570 may increase regardless of the temperature. Accordingly, an error rate of data output from the data sampler 570 may decrease.

As described above, the memory device 500 may control a level of regulated voltages VLDO applied to the WDQS transfer circuit 560 through the voltage regulator 550 based on pre-stored weights WT and current temperature TP. Accordingly, the memory device 500 may adjust delays on the WDQS path according to a temperature sensed in real time without retrainings by the memory controllers 100 and 300.

FIG. 8 illustrates an example operation of the temperature compensator of FIG. 7. With reference to FIGS. 7 and 8, the temperature compensator 530 may calculate temperature changes by comparing the current temperature TP with a reference temperature TREF. For example, a reference temperature TREF may be stored in advance in the temperature compensator 530.

The temperature compensator 530 may generate delay codes DCODE corresponding to weights WT based on temperature changes. For example, different delay codes DCODE may be generated according to the same temperature changes depending on weights WT. As illustrated in FIG. 8, the temperature compensator 530 may generate a first delay code DCODE1 corresponding to a first weight WT1, a second delay code DCODE2 corresponding to a second weight WT2, and a third delay code DCODE3 corresponding to a third weight WT3. As explained with reference to FIG. 6, weights reflect element characteristics of the WDQS transfer circuit 560, and thus, delay codes DCODE generated by the temperature compensator 530 may reflect element characteristics.

FIG. 9 illustrates an example operation of the reference voltage generator and the voltage regulator of FIG. 7. With reference to FIGS. 7 and 9, the reference voltage generator 540 may generate a reference voltage VREF corresponding to a delay code DCODE. For example, as illustrated in FIG. 9, the reference voltage generator 540 may generate first to third reference voltages VREF1 to VREF3 corresponding to first to third delay codes DCODE1 to DCODE3, respectively.

The voltage regulator 550 may generate a regulated voltage VLDO corresponding to a reference voltage VREF. For example, as illustrated in FIG. 9, the voltage regulator 550 may generate first to third regulated voltages VLDO1 to VLDO3 corresponding to first to third reference voltages VREF1 to VREF3, respectively.

As described above, delay codes DCODE reflect element characteristics of the WDQS transfer circuit 560, and thus, regulated voltages VLDO generated by the voltage regulator 550 may reflect the element characteristics. Accordingly, the memory device 500 may adjust delays on the WDQS path based on a regulated voltage VLDO having a level reflecting element characteristics.

Figure 10:
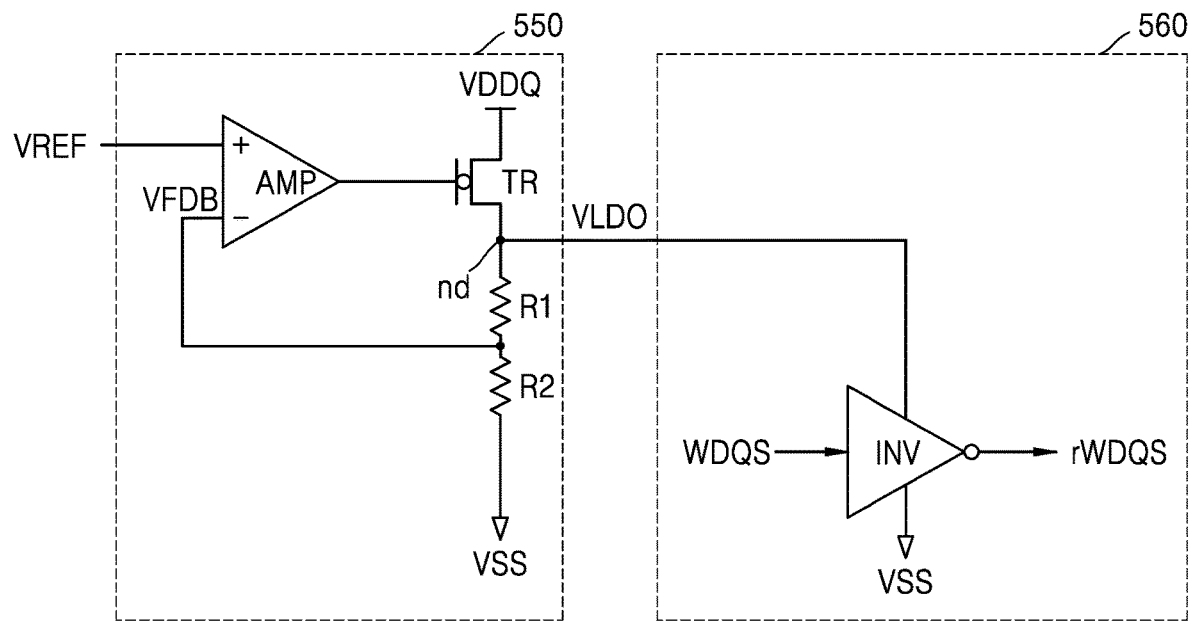
FIG. 10 is an illustrative circuit diagram of the voltage regulator and a WDQS transfer circuit of FIG. 7.

FIG. 10 is an exemplary circuit diagram of the voltage regulator and the WDQS transfer circuit of FIG. 7. With reference to FIGS. 7 and 10, the voltage regulator 550 may include an amplifier AMP, a transistor TR, a first resistor R1, and a second resistor R2. A reference voltage VREF may be input to a first input terminal of the amplifier AMP, and a feedback voltage VFDB may be input to a second input terminal thereof. The amplifier AMP may output a result of comparison between a reference voltage VREF and a feedback voltage VFDB to a gate terminal of the transistor TR. For example, according to the comparison result, the transistor TR may be turned on or turned off. Depending on the on/off state of the transistor TR, a voltage of an output node nd (i.e., a regulated voltage VLDO) may be controlled based on the power supply voltage VDDQ and the ground voltage VSS. When the transistor TR is turned on, the voltage of the output node nd may be increased by the power supply voltage VDDQ. As such, when the voltage of the output node nd is controlled, the level of the regulated voltage VLDO output from the output node nd may remain constant.

The WDQS transfer circuit 560 may include an inverter INV. The inverter INV may output delayed write data strobe signals rWDQS by delaying the write data strobe signals WDQS. Delays of write data strobe signals WDQS by the inverter INV may be controlled according to the regulated voltage VLDO. For example, when the regulated voltage VLDO increases, delays of write data strobe signals WDQS may be reduced. Accordingly, delays on the WDQS path may be adjusted based on the regulated voltage VLDO.

In FIG. 10, the WDQS transfer circuit 560 is described as including a single inverter INV to transfer write data strobe signals WDQS to the data sampler 570; however, the inventive concept is not limited thereto. For example, the WDQS transfer circuit 560 may include multiple inverters operating based on the regulated voltage VLDO. Alternatively, the WDQS transfer circuit 560 may further include at least one inverter operating based on the power supply voltage VDDQ.

Figure 11:
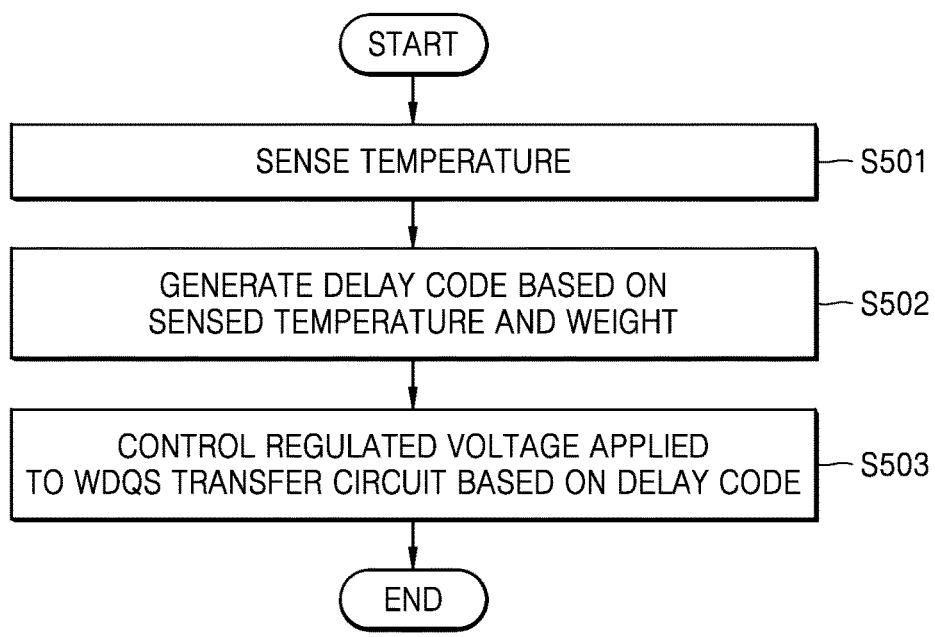
FIG. 11 is an exemplary flowchart illustrating the delay adjustment operation of the memory device of FIG. 7.

FIG. 11 is an exemplary flowchart illustrating the operation of delay adjustment by the memory device of FIG. 7. With reference to FIGS. 7 and 11, in operation S501, the memory device 500 may sense the temperature. For example, the memory device 500 may sense the temperature of the memory device 500 in real time through the temperature sensor 520.

In operation S502, the memory device 500 may generate delay codes based on the sensed temperatures and weights. For example, the memory device 500 may calculate temperature changes by comparing a predetermined reference temperature and the sensed temperatures. The memory device 500 may generate delay codes corresponding to weights based on temperature changes. For example, delay codes may be generated differently according to temperature changes and weights.

In operation S503, the memory device 500 may control the regulated voltage applied to the WDQS transfer circuit 560 based on delay codes. The memory device 500 may adjust delays on the WDQS path by controlling the regulated voltage. For example, the memory device 500 may generate a reference voltage corresponding to a delay code, from the power supply voltage. The memory device 500 may generate a regulated voltage corresponding to a reference voltage. The WDQS transfer circuit 560 may transfer a write data strobe signal WDQS to the data sampler 570 based on the regulated voltage. The transfer timing of write data strobe signal WDQS may vary depending on the regulated voltage. Accordingly, delays on the WDQS path may be adjusted.

As described above, the memory device 500 according to an embodiment may adjust delays on the WDQS path by controlling, through the voltage regulator 550, the level of regulated voltages applied to the circuits on the WDQS path.

Figure 12:
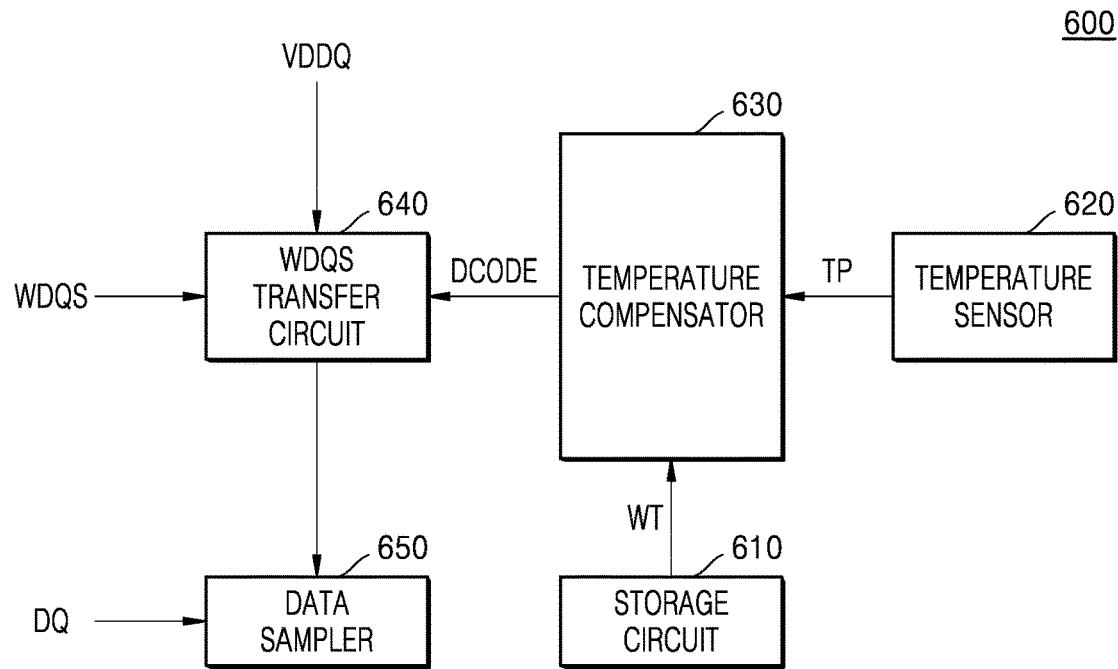
FIG. 12 is a block diagram illustrating the memory device configured to adjust delays on the WDQS path according to an embodiment.

FIG. 12 is a block diagram illustrating the memory device configured to adjust delays on the WDQS circuit according to an embodiment. With reference to FIG. 12, the memory device 600 may correspond to the memory devices 200 and 400 described with reference to FIGS. 1 to 6. Accordingly, repeated descriptions thereof are omitted hereinafter.

The memory device 600 may include a storage circuit 610, a temperature sensor 620, a temperature compensator 630, a WDQS transfer circuit 640, and a data sampler 650. The storage circuit 610, temperature sensor 620, and temperature compensator 630 may correspond to the storage circuit 510, temperature sensor 520, and temperature compensator 530 of FIG. 7, respectively. The WDQS transfer circuit 640 and the data sampler 650 may correspond to the WDQS transfer circuit 230 and the data sampler 240 of FIG. 1, respectively. Accordingly, repeated descriptions thereof are omitted hereinafter.

The temperature compensator 630 may generate delay codes DCODE based on the weights WT from the storage circuit 610 and the current temperature TP from the temperature sensor 620. For example, as described with reference to FIG. 8, the temperature compensator 630 may generate delay codes DCODE corresponding to weights WT based on temperature changes. The temperature compensator 630 may control delay cells of the WDQS transfer circuit 640 based on delay codes DCODE.

The WDQS transfer circuit 640 may transfer write data strobe signal WDQS to the data sampler 650. For example, the WDQS transfer circuit 640 may include delay cells (e.g. repeaters or inverters) for transferring write data strobe signal WDQS. The delay cells of the WDQS transfer circuit 640 may operate by using the power supply voltage VDDQ.

At least one delay cell of the WDQS transfer circuit 640 may be controlled based on delay codes DCODE. For example, an on/off state of transistors of delay cells may be controlled based on delay codes DCODE. Delays of the delay cells may be adjusted based on the on/off state of the transistors. Accordingly, delays of write data strobe signal WDQS output through the WDQS transfer circuit 640 may be adjusted according to delay codes DCODE.

The data sampler 650 may sample the data signal DQ based on the write data strobe signal WDQS. When delays on the WDQS path are adjusted by controlling delay cells, an S/H margin of the data sampler 650 may increase regardless of temperature changes. As a result, an error rate of data output from the data sampler 650 may decrease.

As described above, the memory device 600 does not include the voltage regulator 550 of the memory device 500 of FIG. 7, and therefore may adjust delays of write data strobe signal WDQS by controlling directly delay cells of the WDQS transfer circuit 640. Accordingly, the memory device 600 may adjust delays on the WDQS path according to a temperature sensed in real time without retrainings by the memory controllers 100 and 300.

Figure 13A:
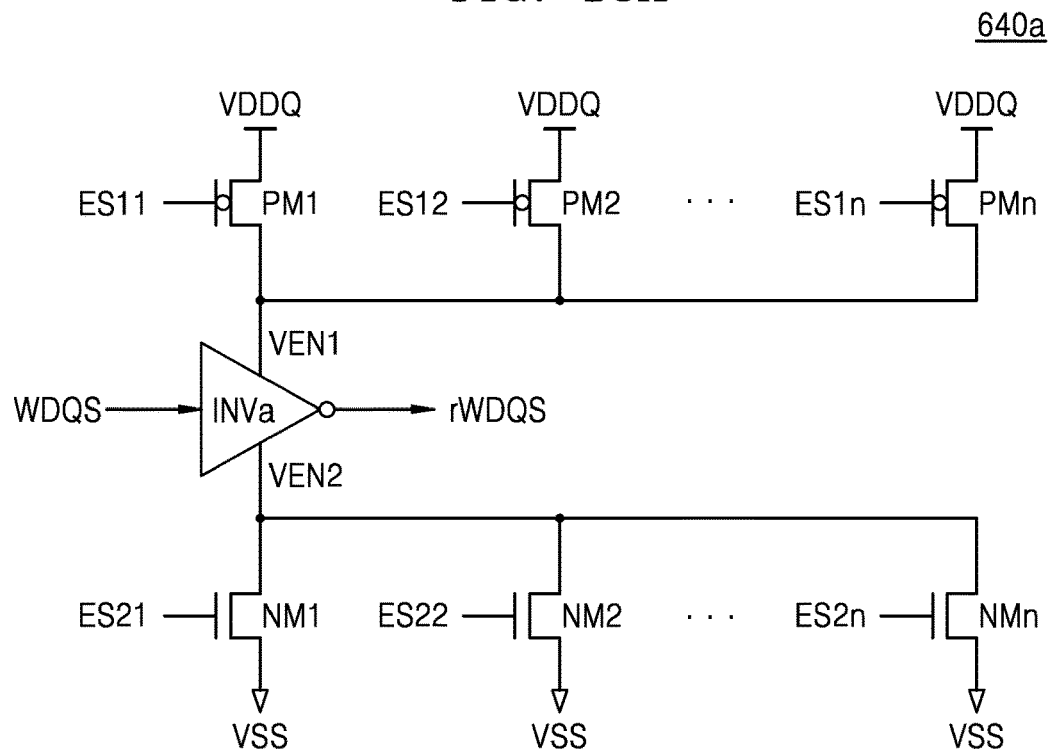
FIGS. 13A and 13B are illustrative circuit diagrams of a WDQS transfer circuit of FIG. 12.
Figure 13B:
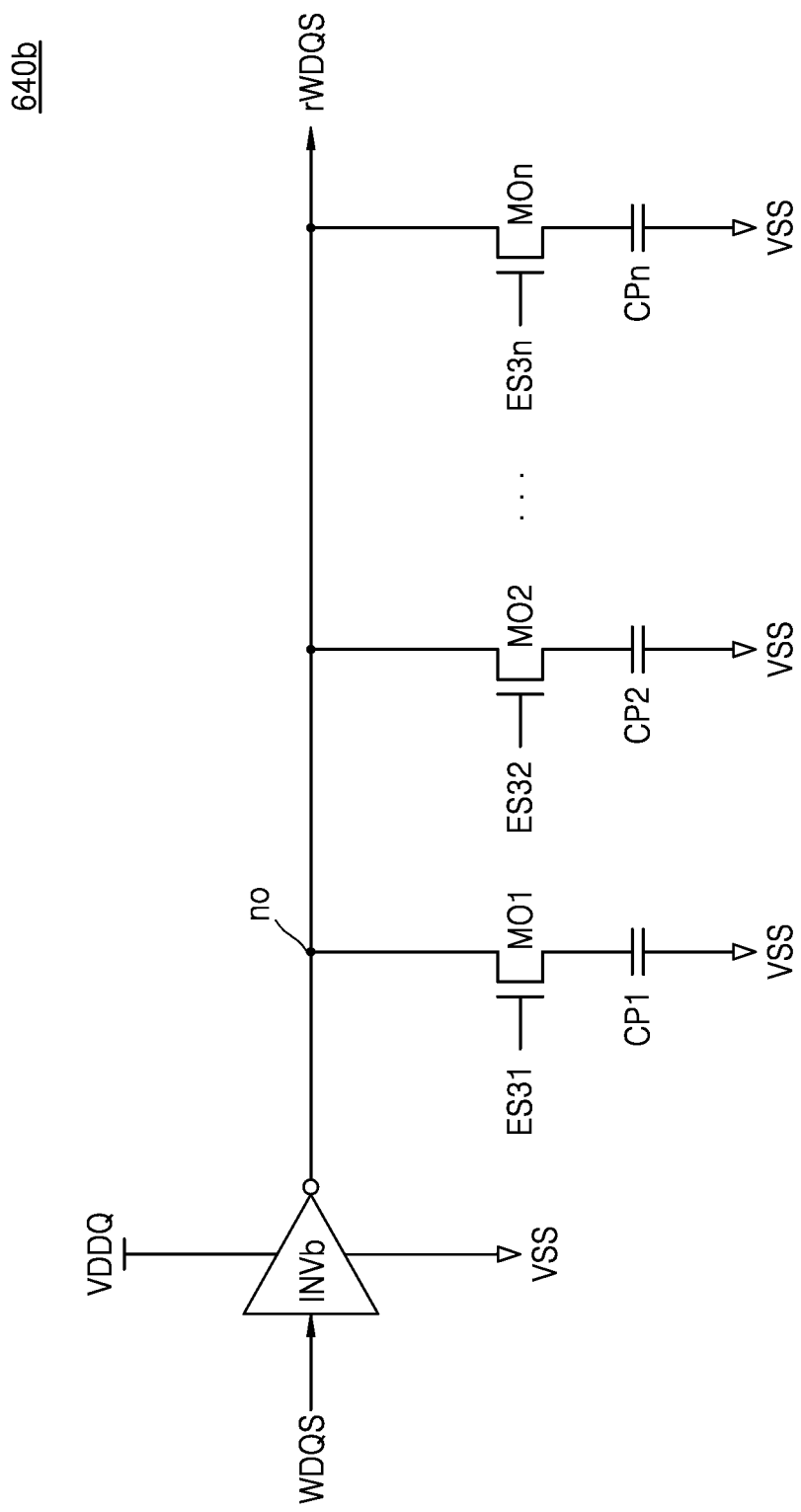

FIGS. 13A and 13B are illustrative circuit diagrams of the WDQS transfer circuit of FIG. 12. In particular, each of FIGS. 13A and 13B illustrates a delay cell of the WDQS transfer circuit 640. However, the inventive concept is not limited thereto, and the WDQS transfer circuit 640 may include a plurality of delay cells.

With reference to FIG. 13A, the WDQS transfer circuit 640*a* may include an inverter INVa, PMOS transistors PM1 to PMn, and NMOS transistors NM1 to NMn. For example, sizes of each PMOS transistor PM1 to PMn may differ, and sizes of each NMOS transistor NM1 to NMn may differ as well. However, the inventive concept is not limited thereto.

The inverter INVa may output delayed write data strobe signal rWDQS by delaying the write data strobe signal WDQS. Delays of write data strobe signal WDQS by the inverter INVa may be adjusted according to a first enable voltage VEN1 and a second enable voltage VEN2. For example, when a voltage difference between the first enable voltage VEN1 and the second enable voltage VEN2 increases, delays of write data strobe signal WDQS may be reduced.

The first enable voltage VEN1 may be controlled based on enable signals ES11 to ES1*n* which control the on/off state of the PMOS transistors PM1 to PMn. The second enable voltage VEN2 may be controlled based on enable signals ES21 to ES2*n* which control the on/off state of the NMOS transistors NM1 to NMn. For example, the enable signals ES11 to ES1*n* and the enable signals ES21 to ES2*n* may be in a complementary relation. In this case, the PMOS transistors PM1 to PMn and the NMOS transistors NM1 to NMn may operate in a symmetrical manner. For example, when the first PMOS transistor PM1 is turned on, the first NMOS transistor NM1 may be turned on.

The enable signals ES11 to ES1*n* may be generated based on delay codes DCODE. In example embodiments, delay codes DCODE may be used as the enable signals ES11 to ES1*n* or the enable signals ES21 to ES2*n*. For example, when delay codes DCODES are used as enable signals ES11 to ES1*n*, the on/off state of PMOS transistors PM1 to PMn may be controlled by the bits of the delay codes DCODE. In this case, the on/off state of NMOS transistors NM1 to NMn may be controlled based on the complementary bits of the delay codes DCODE.

For example, when PMOS transistors PM1 to PMn and NMOS transistors NM1 to NMn in turn-on state are increased based on delay codes DCODE, the first enable voltage VEN1 may be increased by the power supply voltage VDDQ and the second enable voltage VEN2 may be decreased by the ground voltage VSS. Accordingly, delays of write data strobe signal WDQS by the inverter INVa may be reduced.

With reference to FIG. 13B, a WDQS transfer circuit 640*b* may include an inverter INVb and transistors MO1 to MOn. For example, each of the transistors MO1 to MOn may be an NMOS transistor.

The inverter INVb may operate based on the power supply voltage VDDQ and the ground voltage VSS. The inverter INVb may output delayed write data strobe signal rWDQS by delaying the write data strobe signal WDQS. Delays of write data strobe signal WDQS by the inverter INVb may be adjusted according to loading by capacitors CP1 to CPn connected to the output terminal of the inverter INVb. For example, when the loading by the capacitors CP1 to CPn increases, delays of write data strobe signal WDQS may increase as well.

The loading by the capacitors CP1 to CPn may be controlled based on enable signals ES31 to ES3n, which control the on/off state of transistors MO1 to MOn. For example, when the number of transistors MO1 to MOn in turn-on state increases, the loading by the capacitors CP1 to CPn may increase as well. Accordingly, delays of write data strobe signal WDQS by the inverter INVb may be increased.

The enable signals ES31 to ES3n may be generated based on delay codes DCODE. In example embodiments, delay codes DCODE may be used as enable signals ES31 to ES3n. For example, when delay codes DCODE are used as enable signals ES31 to ES3n, the on/off state of the transistors MO1 to MOn may be controlled by the bits of the delay codes DCODE.

As described above, the transistors of delay cells of the WDQS transfer circuit 640 may be controlled based on delay codes DCODE. Accordingly, delays on the WDQS path may be adjusted based on the on/off state of the transistors of delay cells.

Figure 14:
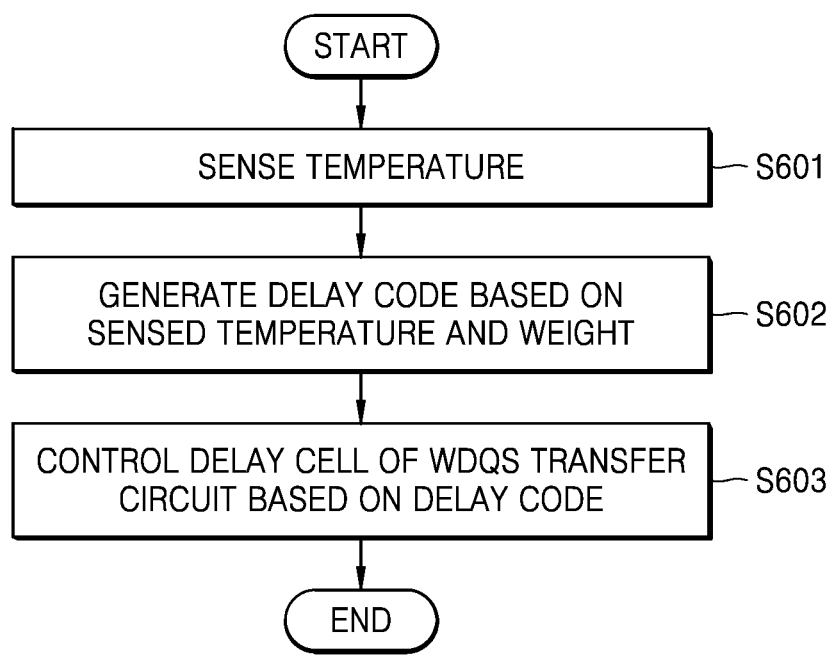
FIG. 14 is an exemplary flowchart illustrating the delay adjustment operation of a memory device of FIG. 12.

FIG. 14 is an exemplary flowchart illustrating the operation of delay adjustment by the memory device of FIG. 12. With reference to FIGS. 12 and 14, in operation S601, the memory device 600 may sense the temperature. For example, the memory device 600 may sense the temperature of the memory device 600 in real time through the temperature sensor 620.

In operation S602, the memory device 600 may generate delay codes based on the sensed temperatures and weights. For example, the memory device 600 may calculate temperature changes by comparing a predetermined reference temperature to sensed temperatures. The memory device 600 may generate delay codes corresponding to weights based on temperature changes.

In operation S603, the memory device 600 may control delay cells of the WDQS transfer circuit 640 based on delay codes. For example, as explained with reference to FIGS. 13A and 13B, the memory device 600 may control on/off states of transistors of delay cells based on delay codes. The memory device 600 may control enable voltages applied to the inverters of delay cells by controlling on/off states of the transistors. Alternatively, the memory device 600 may control the loading of the capacitors of delay cells by controlling on/off states of the transistors. Accordingly, delays of write data strobe signal WDQS through delay cells are adjusted, and delays on the WDQS path may be adjusted.

As described above, the memory device 600 according to an embodiment may adjust delays on the WDQS path without a voltage regulator by controlling the transistors of delay cells of the WDQS transfer circuit 640.

Figure 15:
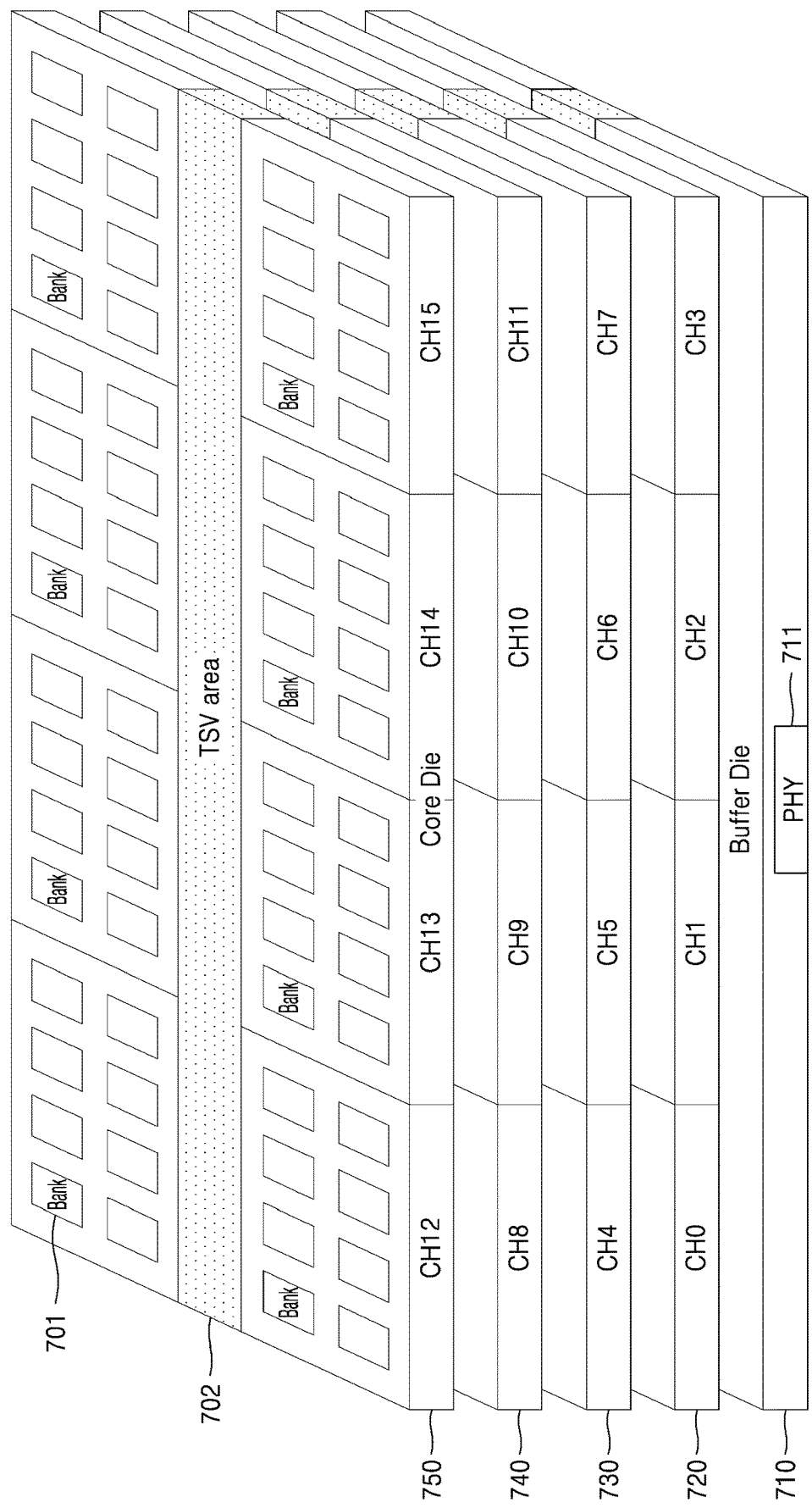
FIG. 15 is a block diagram illustrating a stacked memory device according to some embodiments.

FIG. 15 is a block diagram of the stacked memory device according to embodiments. With reference to FIG. 15, a stacked memory device 700 may correspond to the memory devices 200, 400, 500, and 600 described with reference to FIGS. 1 to 14. The stacked memory device 700 may include a buffer die 710 and a plurality of core dies 720 to 750. For example, the buffer die 710 may be referred to as an interface die, a base die, a logic die, a master die, etc., and each of the core dies 720 to 750 may be referred to as a memory die, a slave die, etc. In FIG. 15, the stacked memory device 700 is described as including four core dies 720 to 750; however, the number of core dies may be changed variously. For example, the stacked memory device 700 may include eight, twelve or sixteen core dies.

The buffer die 710 and the core dies 720 to 750 may be stacked and electrically connected by through silicon vias (TSVs). Accordingly, the stacked memory device 700 may have a three-dimensional memory structure in which multiple dies 710 to 750 are stacked. For example, the stacked memory device 700 may be implemented based on high bandwidth memory (HBM) or hybrid memory cube (HMC) standards.

The stacked memory device 700 may support multiple functionally independent channels (or vaults). For example, as illustrated in FIG. 15, the stacked memory device 700 may support sixteen channels CH0 to CH15. When each of the channels CH0 to CH15 supports 64 data transfer paths (i.e., when there are 64 data signal DQ pins corresponding to each of the channels CH0 to CH15), the stacked memory device 700 including the 16 channels CH0 to CH15 may support 1,024 data transfer paths. However, the inventive concept is not limited thereto. The stacked memory device 700 may support 1,024 or more data transfer paths and various numbers of channels (e.g. eight channels). For example, when the stacked memory device 700 supports eight channels, and each of the channels supports 128 data transfer paths, the stacked memory device 700 may support 1,024 data transfer paths.

Each of the core dies 720 to 750 may support at least one channel. For example, as illustrated in FIG. 15, each of the core dies 720 to 750 may support four channels CH0 to CH3, CH4 to CH7, CH8 to CH11, CH12 to CH15. In such case, the core dies 720 to 750 may each support different channels. However, the inventive concept is not limited thereto, and at least two of the core dies may support the same channel. For example, when the stacked memory device 700 includes eight core dies, one of the four core dies constituting a stack and one of the other four core dies constituting another stack may support the same channel. In this case, the core dies that support the same channel may be differentiated by a stack ID (SID).

Each of the channels may configure an independent command and data interface. For example, each channel may be independently clocked based on an independent timing requirement, or may not be synchronized with each other.

Each of the channels may include a plurality of memory banks 701. Each of the memory banks 701 may include memory cells, a sense amplifier, etc. connected to word lines and bit lines. For example, each of the channels CH0 to CH15 may include 32 memory banks 701. However, the inventive concept is not limited thereto, and each of the channels CH0 to CH15 may include eight or more memory banks 701. In FIG. 15, it is described that the memory banks 701 included in one channel are included in one core die; however, the memory banks 701 included in one channel may be dispersed into a plurality of core dies. For example, when two of the core dies support the first channel CH0, the memory banks 701 of the first channel CH0 may be dispersed into two core dies.

In example embodiments, one channel may be divided into two pseudo channels which operate independently. For example, the pseudo channels may share commands and clock inputs (e.g. a clock signal CK, and/or a clock enable signal CKE) of the channel, but they also may independently decode and execute commands. For example, when one channel supports 64 data transfer paths, each of pseudo channels may support 32 data transfer paths. For example, when one channel includes 32 memory banks 701, each pseudo channel may include 16 memory banks 701.

The buffer die 710 and the core dies 720 to 750 may include a TSV area 702. TSVs configured to penetrate the dies 710 to 750 may be located in the TSV area 702. The buffer die 710 may transmit and receive various signals with the core dies 720 to 750 through the TSVs. Each of the core dies 720 to 750 may transmit and receive signals with the buffer die 710 and other core dies through the TSVs. In this case, the signals may be transmitted and received independently through the TSVs corresponding to each channel. For example, when an external host device (e.g. the memory controller 100 of FIG. 1) transmits a data signal to the first channel CH0 to store data in the memory cell of the first channel CH0, the buffer die 710 may transmit a data signal to the first core die 720 through TSVs corresponding to the first channel CH0. In this manner, the data may be stored in the memory cell of the first channel CH0.

In example embodiments, the power supply voltage VDDQL may be used for transmission of signals through TSVs. The power supply voltage VDDQL may be less than the power supply voltage VDDQ used for overall operation of the buffer die 710. For example, the power supply voltage VDDQ may be 1.1 V when the power supply voltage VDDQL is 0.4 V.

The buffer die 710 may include a physical layer PHY 711. The physical layer 711 may include interface circuits to communicate with an external host device. In example embodiments, the physical layer 711 may include interface circuits corresponding to each of the channels CH0 to CH15. For example, an interface circuit corresponding to one channel may include components 210 to 240 of the memory device 200 of FIG. 1. Signals received from the host device through the physical layer 711 may be transmitted to the core dies 720 to 750 through the TSVs.

In example embodiments, the buffer die 710 may include a channel controller corresponding to each of the channels. The channel controller may manage memory reference operations of a corresponding channel, and determine timing requirements of the corresponding channel.

In example embodiments, the buffer die 710 may include a plurality of pins configured to receive signals from an external host device. As described with reference to FIG. 1, the buffer die 710 may receive a clock signal CK, a command/address signal CA, a write data strobe signal WDQS and a data signal DQ, and transmit a data signal DQ through a plurality of pins.

In example embodiments, the stacked memory device 700 may further include an error correction code (ECC) circuit for detecting and correcting data errors. For example, in a write operation, the ECC circuit may generate parity bits for data transferred from the host device. In a read operation, the ECC circuit may detect and correct errors in data transferred from one of the core dies 720 to 750 by using parity bits, and transmit to the host device the data whose errors have been corrected.

In example embodiments, the stacked memory device 700 may store weights to compensate for variations of delays on the WDQS path according to temperature changes, as described with reference to FIGS. 1 to 14. For example, weights may be determined in the initialization process or test process of the stacked memory device 700. The stacked memory device 700 may adjust delays on the WDQS path according to real time temperatures based on the stored weights. As a result, even when the temperature of the stacked memory device 700 changes, the stacked memory device 700 may maintain constant delays on the WDQS path without retrainings by the host device. Therefore, an S/H margin for sampling a data signal DQ may increase regardless of temperature changes.

Figure 16:
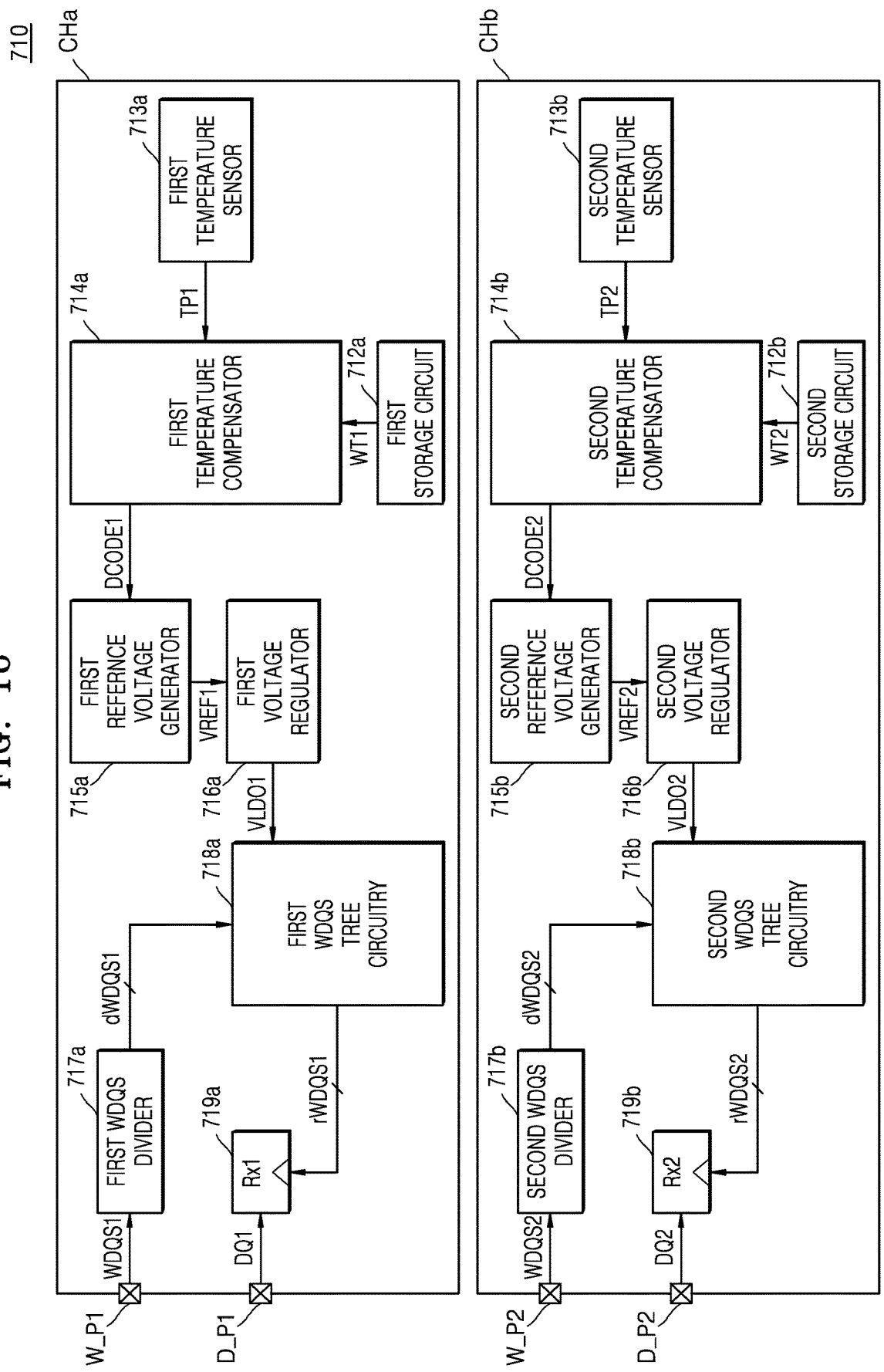
FIG. 16 is a block diagram illustrating a buffer die of FIG. 15.

FIG. 16 is a block diagram of the buffer die of FIG. 15. With reference to FIG. 16, the buffer die 710 may support the first channel CHa and the second channel CHb. The buffer die 710 may include, corresponding to the first channel CHa, a first storage circuit 712a, a first temperature sensor 713a, a first temperature compensator 714a, a first reference voltage generator 715a, a first voltage regulator 716a, a first WDQS divider 717a, a first WDQS tree circuitry 718a, and a first receiver 719a. The buffer die 710 may include a first write data strobe pin W_P1 and a first data pin D_P1 to receive the first write data strobe signal WDQS1 and the first data signal DQ1 provided to the first channel CHa.

The buffer die 710 may include, corresponding to the second channel CHb, a second storage circuit 712b, a second temperature sensor 713b, a second temperature compensator 714b, a second reference voltage generator 715b, a second voltage regulator 716b, a second WDQS divider 717b, a second WDQS tree circuitry 718b, and a second receiver 719b. The buffer die 710 may include a second write data strobe pin W_P2 and a second data pin D_P2 to receive the second write data strobe signal WDQS2 and the second data signal DQ2 provided to the second channel CHb.

The components 712b to 719b and the pins W_P2, D_P2 corresponding to the second channel CHb may correspond to the components 712a to 719a and the pins W_P1, D_P1 corresponding to the first channel CHa, respectively. Accordingly, hereinafter, the buffer die 710 will be described focusing on the components 712a to 719a and the pins W_P1, D_P1 of the first channel CHa for the sake of convenient explanation.

The first storage circuit 712a, the first temperature sensor 713a, the first temperature compensator 714a, the first reference voltage generator 715a, and the first voltage regulator 716a may correspond to the storage circuit 510, the temperature sensor 520, the temperature compensator 530, the reference voltage generator 540, and the voltage regulator 550 of FIG. 7, respectively. The first WDQS divider 717a and the first WDQS tree circuitry 718a may correspond to the WDQS transfer circuit 560 of FIG. 7, and the first receiver 719a may correspond to the data sampler 570 of FIG. 7. Accordingly, repeated descriptions thereof are omitted hereinafter.

The first storage circuit 712a may store a first weight WT1 corresponding to the first channel CHa. The first weight WT1 may be determined in the initialization process or test process for the first channel CHa. The first temperature sensor 713a may be a temperature sensor located adjacent to interface circuits corresponding to the first channel CHa (e.g. the first WDQS divider 717a, the first WDQS tree circuitry 718a, and the first receiver 719a). The first current temperature TP1 sensed by the first temperature sensor 713a may be provided to the first temperature compensator 714a.

The first temperature compensator 714a may generate a first delay code DCODE1 based on the first weight WT1 and the first current temperature TP1. The first reference voltage generator 715a may generate a first reference voltage VREF1 based on the first delay code DCODE1, and the first voltage regulator 716a may generate a first regulated voltage VLDO1 based on the first reference voltage VREF1.

The first WDQS divider 717a may generate first internal write data strobe signals dWDQS1 based on the first write data strobe signals WDQS1. For example, the first WDQS divider 717a may divide the first write data strobe signal WDQS1 and generate first internal write data strobe signal dWDQS1 having different phases. In this case, the frequency of each first internal write data strobe signal dWDQS1 may be less than the frequency of the first write data strobe signal WDQS1. In example embodiments, a separate receiver (or a buffer) configured to receive first write data strobe signal WDQS1 may be arranged between the first WDQS divider 717a and the first write data strobe pin W_P1.

The first WDQS tree circuitry 718a may transfer the first internal write data strobe signal dWDQS1 to the first receiver 719a through a plurality of repeaters (or inverters). In example embodiments, the first WDQS tree circuitry 718a may transfer the first internal write data strobe signal dWDQS1 based on the first regulated voltage VLDO1. For example, the first WDQS tree circuitry 718a may include an inverter which operates based on the first regulated voltage VLDO1. When the first regulated voltage VLDO1 is controlled according to the first delay code DCODE1, delays of each first internal write data strobe signal dWDQS1 transferred through the first WDQS tree circuitry 718a may be adjusted. Accordingly, the first WDQS tree circuitry 718a may transfer the first internal write data strobe signal rWDQS1 with adjusted delays to the first receiver 719a.

The first receiver 719a may sample the first data signal DQ1 based on the first internal write data strobe signal rWDQS1. For example, the first receiver 719a may sample the first data signal DQ1 at a rising edge or falling edge timing of each first internal write data strobe signal rWDQS1.

As described above, the first regulated voltage VLDO1 may be controlled based on the first weight WT1 and the first current temperature TP1, and delays on a path through which the first write data strobe signal WDQS1 is transferred to the first receiver 719a may be adjusted based on the first regulated voltage VLDO1.

Similarly, the second regulated voltage VLDO2 may be controlled based on the second weight WT2 and the second current temperature TP2, and delays on a path through which the second write data strobe signal WDQS2 is transferred to the second receiver 719b may be adjusted based on the second regulated voltage VLDO2.

The second weight WT2 for controlling the second regulated voltage VLDO2 may be determined in the initialization process or the test process for the second channel CHb. For example, the second weight WT2 may be different from the first weight WT1. The second current temperature TP2 for controlling the second regulated voltage VLDO2 may be sensed by the second temperature sensor 713b located adjacent to interface circuits corresponding to the second channel CHb (e.g. the second WDQS divider 717b, the second WDQS tree circuitry 718b, and the second receiver 719b). For example, the second current temperature TP2 may be different from the first current temperature TP1. Accordingly, the second regulated voltage VLDO2 may be different from the first regulated voltage VLDO1, and delays on the WDQS path adjusted based on the second regulated voltage VLDO2 may be different from delays on the WDQS path adjusted based on the first regulated voltage VLDO1.

As described above, when the buffer die 710 supports a plurality of channels CHa, CHb, the buffer die 710 may independently adjust delays on the WDQS path corresponding to each of the channels CHa, CHb. Accordingly, even when characteristics of the elements on the WDQS path corresponding to the first channel CHa are different from those of the elements on the WDQS path corresponding to the second channel CHb, variations of delays on the WDQS path corresponding to each of the channels CHa, CHb can be compensated. Therefore, S/H margins for sampling a data signal in each channel may increase.

FIG. 16 illustrates embodiments in which the buffer die 710 adjusts delays on the WDQS path through the voltage regulators 716a, 716b, as explained with reference to FIGS. 7 to 11; however, the inventive concept is not limited thereto. For example, the buffer die 710 may adjust delays by controlling the transistors of the delay cells of the WDQS tree circuitries 718a and 718b, as described with reference to FIGS. 12 to 14.

Figure 17:
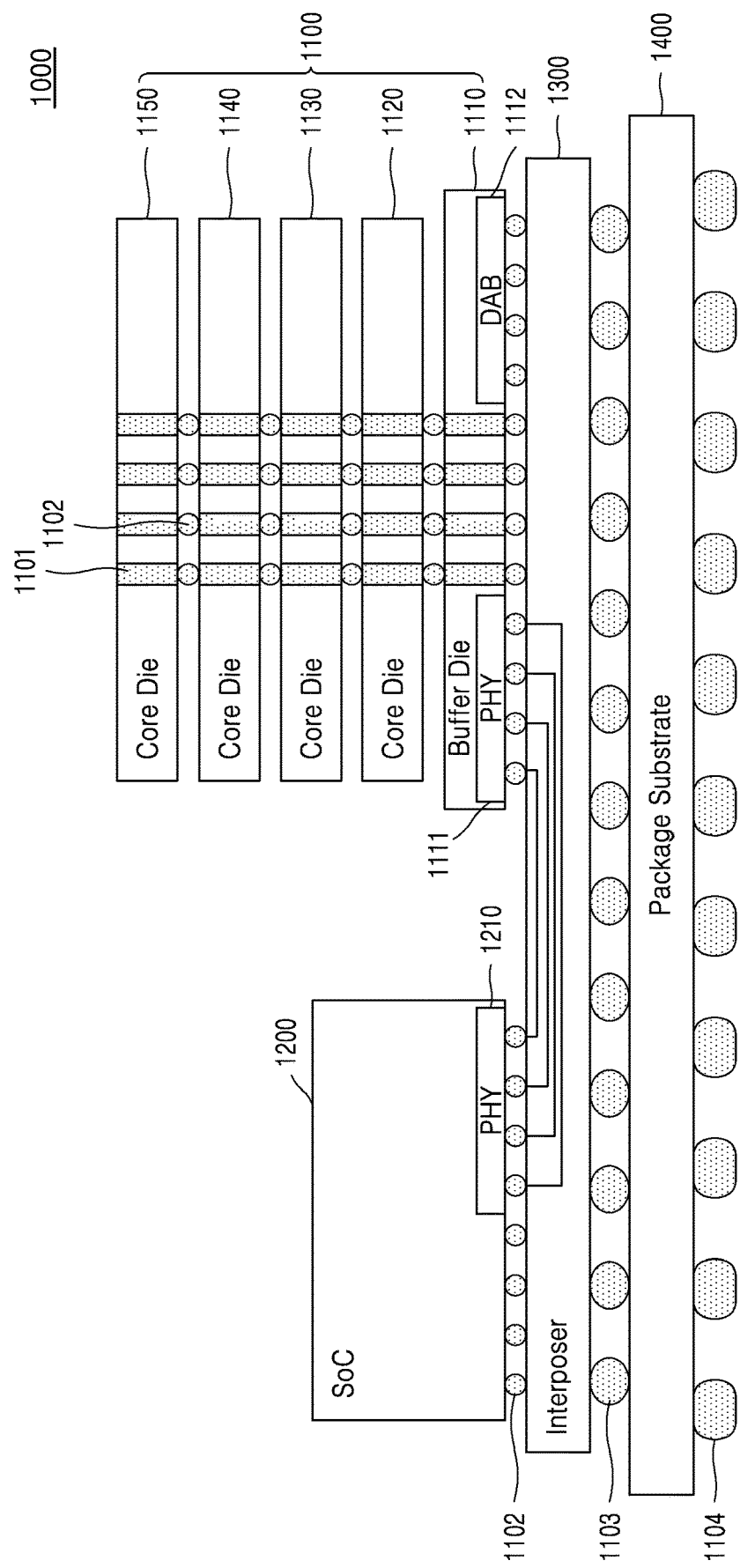
FIG. 17 is a diagram illustrating a semiconductor package according to an embodiment.

FIG. 17 is an illustrative diagram of a semiconductor package according to an embodiment. With reference to FIG. 17, the semiconductor package 1000 may include a stacked memory device 1100, a System-on-Chip 1200, an interposer 1300, and a package substrate 1400. The stacked memory device 1100 may include a buffer die 1110 and core dies 1120 to 1150. The stacked memory device 1100 may correspond to the stacked memory device 700 described with reference to FIG. 15.

Each of the core dies 1120 to 1150 may include memory cells for storing data. The buffer die 1110 may include a physical layer 1111 and a direct access area DAB 1112. The physical layer 1111 may be electrically connected with the physical layer 1210 of the System-on-Chip 1200 through the interposer 1300. The stacked memory device 1100 may receive signals from the System-on-Chip 1200 through the physical layer 1111, or transmit signals to the System-on-Chip 1200. The physical layer 1111 may include components of the buffer die 710 described with reference to FIGS. 15 and 16.

The direct access area 1112 may provide an access path which enables testing of the stacked memory device 1100 without it being processed through the System-on-Chip 1200. The direct access area 1112 may include a conductive means (e.g. a port or pin) capable of direct communication with an external test device. The test signals received through the direct access area 1112 may be transmitted to the core dies 1120 to 1150 through the TSVs. The data read from the core dies 1120 to 1150 may be transmitted to a test device through the TSVs and the direct access area 1112 for testing of the core dies 1120 to 1150. In this manner, direct access tests may be performed in relation to the core dies 1120 to 1150.

The buffer die 1110 and the core dies 1120 to 1150 may be electrically connected to each other via the TSVs 1101 and bumps 1102. The buffer die 1110 may receive signals provided to each channel through the bumps 1102 allocated per channel from the System-on-Chip 1200, or transmit the signals to the System-on-Chip 1200 through the bumps 1102. For example, the bumps 1102 may be microbumps.

The System-on-Chip 1200 may execute applications supported by the semiconductor package 1000 by using the stacked memory device 1100. For example, the System-on-Chip 1200 may include at least one of a central processing unit (CPU), application processor (AU), graphic processing unit (GPU), neural processing unit (NPU), tensor processing unit (TPU), vision processing unit (VPU), image signal processor (ISP), and digital signal processor (DSP) to execute specialized operations.

The System-on-Chip 1200 may control overall operations of the stacked memory device 1100. The System-on-Chip 1200 may correspond to the memory controllers 100 and 300 described above. The System-on-Chip 1200 may include the physical layer 1210. The physical layer 1210 may include an interface circuit for transmitting and receiving signals with the physical layer 1111 of the stacked memory device 1100. For example, the physical layer 1210 may include components of the memory controller 100 of FIG. 1. The System-on-Chip 1200 may provide various signals to the physical layer 1111 through the physical layer 1210. The signals provided to the physical layer 1111 may be transferred to the core dies 1120 to 1150 through the interface circuit of the physical layer 1111 and the TSVs 1101.

The interposer 1300 may connect the stacked memory device 1100 and the System-on-Chip 1200. The interposer 1300 may connect the physical layer 1111 of the stacked memory device 1100 and the physical layer 1210 of the System-on-Chip 1200, and provide physical paths formed by using conductive materials. Accordingly, the stacked memory device 1100 and the System-on-Chip 1200 may be stacked over the interposer 1300 to transmit and receive signals from each other.

The bumps 1103 may be attached to the top of the package substrate 1400, and solder balls 1104 may be attached to the bottom of the package substrate 1400. For example, the bumps 1103 may be flip chip bumps. The interposer 1300 may be stacked over the package substrate 1400 by the bumps 1103. The semiconductor package 1000 may transmit and receive signals with other external packages or semiconductor devices through the solder balls 1104. For example, the package substrate 1400 may be a printed circuit board (PCB).

In example embodiments, the physical layer 1111 of the buffer die 1110 may receive a write data strobe signal WDQS and a data signal DQ from the System-on-Chip 1200 through the bumps 1102. The physical layer 1111 may sample a data signal DQ based on a write data strobe signal WDQS with adjusted delays, as described with reference to FIGS. 1 to 16.

Figure 18:
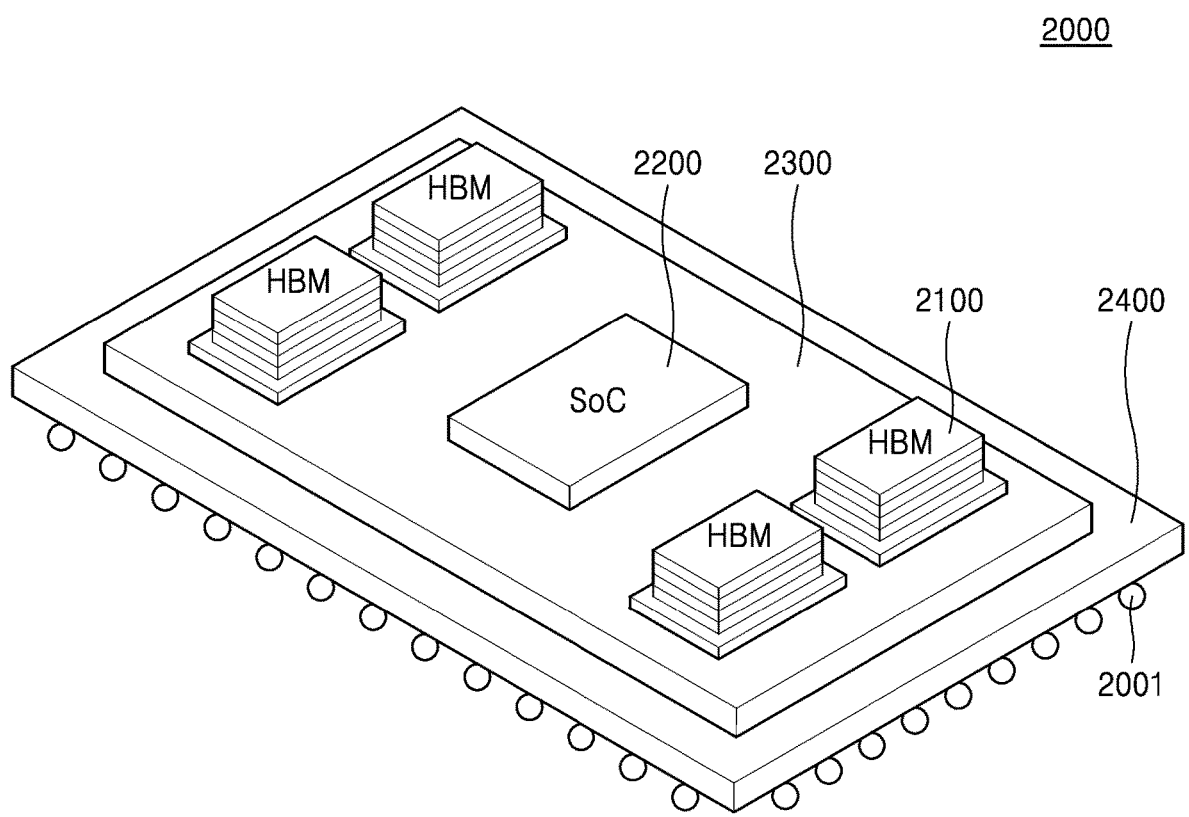
FIG. 18 is a diagram illustrating an implementation example of a semiconductor package according to an embodiment.

FIG. 18 is a diagram illustrating an implementation example of the semiconductor package according to an embodiment. With reference to FIG. 18, the semiconductor package 2000 may include a plurality of stacked memory devices 2100 and the System-on-Chip 2200. Each of the stacked memory devices 2100 may correspond to the stacked memory device 1100 of FIG. 17, and the System-on-Chip 2200 may correspond to the System-on-Chip 1200 of FIG. 17. The stacked memory devices 2100 and the System-on-Chip 2200 may be stacked over the interposer 2300, and the interposer 2300 may be stacked over the package substrate 2400. The semiconductor package 2000 may transmit and receive signals with other external packages or semiconductor devices through the solder balls 2001 attached to the bottom of the package substrate 2400.

Each of the stacked memory devices 2100 may be implemented based on the HBM standard. However, the inventive concept is not limited thereto, and each of the stacked memory devices 2100 may be implemented based on the graphics double data rate (GDDR), HMC, or Wide input/output (I/O) standards.

The System-on-Chip 2200 may include at least one processor such as a CPU, AP, GPU, NPU, etc. and multiple memory controllers to control a plurality of stacked memory devices 2100. The System-on-Chip 2200 may transmit and receive signals with corresponding stacked memory devices through memory controllers.

Figure 19:
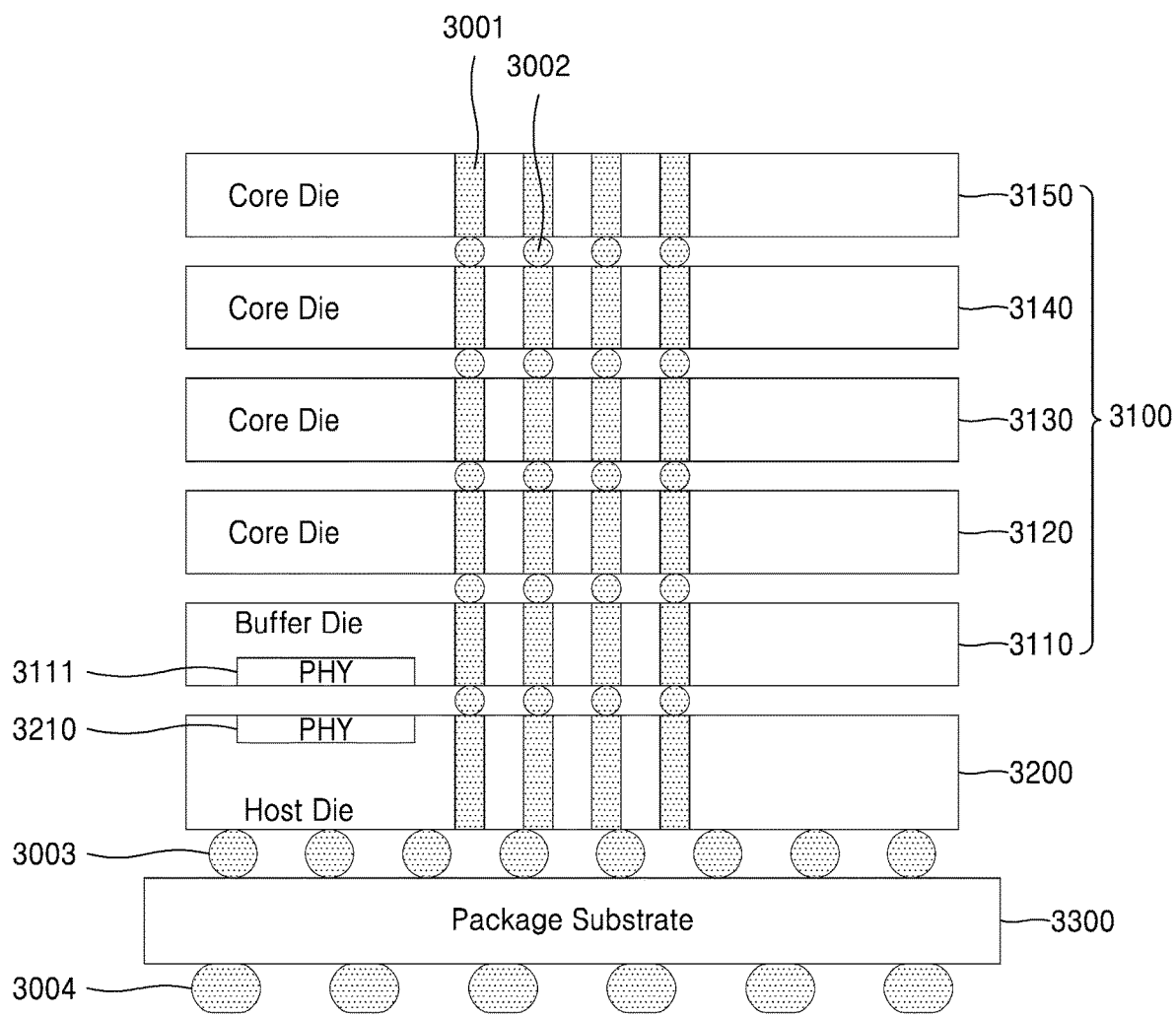
FIG. 19 is a diagram illustrating a semiconductor package according to another embodiment.

FIG. 19 is a diagram illustrating the semiconductor package according to another embodiment. With reference to FIG. 19, the semiconductor package 3000 may include a stacked memory device 3100, a host die 3200, and a package substrate 3300. The stacked memory device 3100 may include a buffer die 3110 and core dies 3120 to 3150. The buffer die 3110 may include a physical layer 3111 configured to communicate with a host die 3200, and each of the core dies 3120 to 3150 may include memory cells for storing data. The stacked memory device 3100 may correspond to the stacked memory device 700 described with reference to FIGS. 15 and 16.

The host die 3200 may include a physical layer 3210 configured to communicate with the stacked memory device 3100. The physical layer 3111 and the physical layer 3210 may communicate via the TSVs 3001. The host die 3200 may correspond to the memory controllers 100 and 300 described above. The physical layer 3111 may include components of the memory device described with reference to FIGS. 1 to 16. The host die 3200 may include a processor configured to control overall operations of the semiconductor package 3000 and to execute applications supported by the semiconductor package 3000. For example, the host die 3200 may include at least one processor such as a CPU, AP, GPU, NPU, etc.

The stacked memory device 3100 may be located over the host die 3200 based on the TSVs 3001 to be stacked vertically on the host die 3200. Accordingly, the buffer die 3110, the core dies 3120 to 3150, and the host die 3200 may be electrically connected to each other without an interposer through the TSVs 3001 and the bumps 3002. For example, the bumps 3002 may be microbumps.

The bumps 3003 may be attached to the top of the package substrate 3300, and the solder balls 3004 may be attached to the bottom of the package substrate 3300. For example, the bumps 3003 may be flip chip bumps. The host die 3200 may be stacked over the package substrate 3300 by the bumps 3003. The semiconductor package 3000 may transmit and receive signals with other external packages or semiconductor devices through the solder balls 3004.

In example embodiments, the physical layer 3111 of the buffer die 3110 may receive a write data strobe signal WDQS and a data signal DQ from the host die 3200 through the TSVs 3001. The physical layer 3111 may sample a data signal DQ based on a write data strobe signal WDQS with adjusted delays, as described with reference to FIGS. 1 to 16.

In another embodiment, the stacked memory device 3100 may be implemented by only core dies 3120 to 3150 without a buffer die 3110. In such case, each of the core dies 3120 to 3150 may further include an interface circuit configured to communicate with the host die 3200. On this occasion, each of the core dies 3120 to 3150 may transmit and receive signals with the physical layer 3210 of the host die 3200 through the TSVs 3001.

While the inventive concept has been particularly shown and described with reference to embodiments thereof, it will be understood that various changes in form and details may be made therein without departing from the spirit and scope of the following claims.

What is claimed is:

1. A memory system comprising:
  a memory device configured to monitor a first oscillator count value for a write data strobe signal for sampling a data signal at a first temperature, and a second oscillator count value for the write data strobe signal for sampling the data signal at a second temperature; and
  a memory controller configured to determine a weight based on the first oscillator count value and the second oscillator count value in an initialization process of the memory device or in a test process for the memory device, wherein the memory device includes a temperature sensor configured to sense a range of temperatures, including the first temperature and the second temperature, of the memory device, and wherein the memory device is configured to sample the data signal by adjusting a delay on a transfer path of the write data strobe signal according to a sensed temperature of the memory device and the weight.

2. The memory system of claim 1, wherein the weight represents an amount of a delay variation for the write data strobe signal according to the sensed temperature of the memory device, and wherein the sensed temperature is sensed in a real time.

3. The memory system of claim 1, wherein the memory device is configured to store the weight in a mode register in response to a mode register set command provided from the memory controller.

4. The memory system of claim 1, wherein the memory device is configured to store the weight in a test mode register or a fuse in response to a test mode register set command provided from the memory controller.

5. The memory system of claim 1, wherein the memory device comprises:

a data sampler configured to sample the data signal based on the write data strobe signal; and a write data strobe signal transfer circuit configured to transfer the write data strobe signal to the data sampler.

6. The memory system of claim 5, wherein the memory device further comprises:

a write data strobe signal oscillator configured to match the write data strobe signal transfer circuit; and a counter configured to calculate the first oscillator count value by counting a first oscillation number of the write data strobe signal oscillator at the first temperature, and to calculate the second oscillator count value by counting a second oscillation number of the write data strobe signal oscillator at the second temperature.

7. The memory system of claim 6, wherein the write data strobe signal oscillator and the counter are configured to operate in response to a write data strobe signal oscillator enable command provided from the memory controller at each of the first temperature and the second temperature.

8. The memory system of claim 5, wherein the memory device further comprises:

a temperature compensator configured to generate a delay code based on the sensed temperature and the weight, and wherein the write data strobe signal transfer circuit is configured to transfer the write data strobe signal to the data sampler based on the delay corresponding to the delay code.

9. The memory system of claim 8, wherein the memory device further comprises:

a reference voltage generator configured to generate a reference voltage from a power supply voltage based on the delay code; and a voltage regulator configured to generate a regulated voltage based on the reference voltage, and wherein the write data strobe signal transfer circuit is configured to transfer the write data strobe signal to the data sampler by using the regulated voltage.

10. The memory system of claim 8, wherein the write data strobe signal transfer circuit comprises multiple transistors configured to operate in an on or off state according to the delay code.

11. The memory system of claim 1, wherein the memory controller is configured to determine the weight in an initialization process of the memory device or in a test process for the memory device.

12. An operating method of a memory system including a memory controller and a memory device configured to sample a data signal provided from the memory controller based on a write data strobe signal provided from the memory controller, the method comprising:

requesting, by the memory controller, a first oscillator count value of the write data strobe signal at a first temperature from the memory device;

transmitting, by the memory device, the first oscillator count value to the memory controller;

requesting, by the memory controller, a second oscillator count value of the write data strobe signal at a second temperature from the memory device;

transmitting, by the memory device, the second oscillator count value to the memory controller;

setting, by the memory controller, a weight determined based on the first oscillator count value and the second oscillator count value to the memory device in an initialization process of the memory device or in a test process for the memory device;

sensing of a temperature of the memory device in a real time; and sampling, by the memory device, the data signal by adjusting a delay on a transfer path of the write data strobe signal according to a sensed temperature of the memory device and the weight.

13. The operating method of claim 12, wherein the weight represents an amount of delay variation for the write data strobe signal according to the sensed temperature of the memory device.

14. The operating method of claim 12, further comprising transmitting, by the memory controller, a first write data strobe signal oscillator enable command to the memory device at the first temperature, prior to the requesting for the first oscillator count value;

counting, by the memory device, a number of oscillations of the write data strobe signal in response to the first write data strobe signal oscillator enable command;

transmitting, by the memory controller, a second write data strobe signal oscillator enable command to the memory device at the second temperature, prior to the requesting for the second oscillator count value; and counting, by the memory device, a number of oscillations of the write data strobe signal in response to the second write data strobe signal oscillator enable command.

15. The operating method of claim 12, wherein the setting of the weight to the memory device by the memory controller includes transmission of a mode register set command to the memory device.

16. The operating method of claim 12, wherein the setting of the weight to the memory device by the memory controller further includes transmission of a test mode register set command to the memory device.

17. The operating method of claim 12, wherein the sampling of the data signal by the memory device includes:

generating a delay code based on the sensed temperature and the weight; and adjusting the delay on the transfer path of the write data strobe signal according to the delay code.

18. A memory device comprising:
a data sampler configured to sample a data signal based on a write data strobe signal;
a storage circuit configured to store a weight representing an amount of variations of a delay on a transfer path of the write data strobe signal according to a temperature change;
a temperature sensor configured to sense temperature;
a temperature compensator configured to generate a delay code based on the sensed temperature and the weight;
a reference voltage generator configured to generate a reference voltage from a power supply voltage based on the delay code;
a voltage regulator configured to generate a regulated voltage based on the reference voltage; and
a write data strobe signal transfer circuit configured to transfer the write data strobe signal to the data sampler by using the regulated voltage.

19. The memory device of claim 18, further comprising a first pin configured to receive the data signal; and
a second pin configured to receive the write data strobe signal, and
wherein a data signal path corresponding to a first path, which is from the first pin to the data sampler, does not match the transfer path of the write data strobe signal corresponding to a second path, which is from the second pin to the data sampler.

20. The memory device of claim 18, wherein the write data strobe signal transfer circuit comprises:
a write data strobe signal divider configured to generate an internal write data strobe signal by dividing the write data strobe signal; and
a write data strobe signal tree circuitry configured to transfer the internal write data strobe signal to the data sampler by using the regulated voltage.

* * * * *